US 7,456,603 B2

(12) United States Patent
Kanekawa et al.

(10) Patent No.: US 7,456,603 B2
(45) Date of Patent: Nov. 25, 2008

(54) PHASE DETECTION CIRCUIT, RESOLVER/DIGITAL CONVERTER USING THE CIRCUIT, AND CONTROL SYSTEM USING THE CONVERTER

(75) Inventors: Nobuyasu Kanekawa, Hitachi (JP); Shoji Sasaki, Hitachinaka (JP); Katsuya Oyama, Hitachinaka (JP); Tomonobu Koseki, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 125 days.

(21) Appl. No.: 11/488,158

(22) Filed: Jul. 18, 2006

(65) Prior Publication Data

US 2007/0029955 A1 Feb. 8, 2007

(30) Foreign Application Priority Data

Jul. 19, 2005 (JP) ............................. 2005-207960
Jun. 9, 2006 (JP) ............................. 2006-160419

(51) Int. Cl.
*H02P 23/00* (2006.01)

(52) U.S. Cl. .................. 318/807; 318/607; 341/112; 341/116

(58) Field of Classification Search ................ 318/807, 318/607; 341/112, 116
See application file for complete search history.

(56) References Cited

U.S. PATENT DOCUMENTS

| | | | | |
|---|---|---|---|---|
| 4,075,698 A | * | 2/1978 | Lode ........................... | 702/72 |
| 4,933,674 A | * | 6/1990 | Gasperi et al. ............... | 341/116 |
| 5,162,798 A | * | 11/1992 | Yundt .......................... | 341/116 |
| 5,815,424 A | | 9/1998 | Kushihara | |
| 6,278,388 B1 | * | 8/2001 | Kushihara ................... | 341/112 |
| 6,972,700 B2 | * | 12/2005 | Kanekawa et al. .......... | 341/116 |
| 6,980,134 B2 | * | 12/2005 | Ely et al. ...................... | 341/20 |
| 7,009,535 B2 | | 3/2006 | Kanekawa et al. | |
| 2002/0173931 A1 | | 11/2002 | Dudler et al. | |

FOREIGN PATENT DOCUMENTS

| | | |
|---|---|---|
| JP | 07-131972 | 5/1995 |
| JP | 09-13718 | 11/1995 |
| JP | 09-126809 | 10/1996 |
| JP | 09-145757 | 6/1997 |
| JP | 2000-353957 | 6/1999 |
| JP | 2005-003530 | 1/2005 |
| JP | 2005-315840 | 11/2005 |
| JP | 2006-021552 | 1/2006 |

OTHER PUBLICATIONS

European Search Report dated Nov. 2, 2006 (Eleven (11) pages).

* cited by examiner

*Primary Examiner*—Rita Leykin
(74) *Attorney, Agent, or Firm*—Crowell & Moring LLP

(57) ABSTRACT

A small-sized and low-cost phase detection circuit which has improved noise immunity. The phase detection circuit comprises a multiplier for multiplying an input signal by a reference signal and outputting a first signal, an integration circuit for integrating the first signal and outputting a second signal, a phase estimation circuit for estimating phase information based on the second signal, and a reference signal generation circuit for generating the reference signal based on the estimated phase information. Since the phase is detected based on information representing an entire waveform, the influence of local noise can be diluted and noise immunity can be improved.

16 Claims, 30 Drawing Sheets

PHASE DETECTION CIRCUIT, RESOLVER/DIGITAL CONVERTER USING THE CIRCUIT, AND CONTROL SYSTEM USING THE CONVERTER

BACKGROUND OF THE INVENTION

1. Field of the Invention

The present invention relates to a resolver/digital converter, and more particularly to a small-sized and low-cost resolver/digital converter having noise immunity.

2. Description of the Related Art

In a servo control system, a rotational angle sensor is required to detect a rotational angle and to perform feedback control. In control of a brushless motor, a rotational angle sensor is also required because of the necessity of supplying a current to a motor coil depending on a motor rotational angle. Thus, the rotational angle sensor is required in not only the servo control system, but also in other systems. As the rotational angle sensor, a resolver has hitherto been widely used from the advantageous features of robustness and environment resistance which are attributable to its simple construction.

Further, a resolver/digital converter has been developed which is used to convert a signal from the resolver to a rotational angle and to input the rotational angle, as digital data, to a microcomputer, etc. (see Patent Document 1; JP-A-2000-353957, Patent Document 2; JP-A-9-126809, Patent Document 3; JP-A-7-131972, Patent Document 4; JP-A-9-133718, Patent Document 5; JP-A-9-145757, and Patent Document 6; JP-A-2005-3530).

SUMMARY OF THE INVENTION

Among those known techniques, the method disclosed in Patent Document 1 is not yet sufficiently satisfactory in point of realizing a smaller size and a lower cost when a resolver/digital converter is manufactured in the IC form. With the disclosed method, precise Sine and Cosine values must be obtained in order to execute computation in a multiplier (control deviation computing unit) 200. Therefore, detailed table values must be stored in a SIN-ROM 60 and a COS-ROM 61. When interpolation is performed to reduce the number of table values, a large amount of computations is required for the interpolation, thus resulting in a longer computation time or the need of a circuit capable of executing high-speed operation. The necessity of using multiplication type D/A converters 51 and 52 in a primary part of the multiplier (control deviation computing unit) 200 is another factor of increasing the circuit scale. For those reasons, the method disclosed in Patent Document 1 can not provide a small-sized and a low-cost resolver/digital converter.

The method disclosed in Patent Document 2 can provide a smaller circuit scale than the method disclosed in Patent Document 1 and is advantageous in being able to realize a smaller size and a lower cost when the resolver/digital converter is manufactured in the IC form. However, because the method disclosed in Patent Document 2 is more susceptible to the influence of noise, it is not yet sufficiently satisfactory in point of nose immunity during operation of the resolver/digital converter.

More specifically, in the method disclosed in Patent Document 2, a value of a counter 12 is latched by latch circuits 19 and 20 at zero-cross points, which are detected by zero-cross detectors 17 and 18, to obtain phases of signals Y1 and Y2. Therefore, when noise is mixed in the signal at the zero-cross timing, the operation of obtaining the phase and the operation of the resolver/digital converter are affected to a large extent, thus resulting in a possibility that an error occurs in the converted rotational angle. Further, when a center voltage of a resolver signal, i.e., a bias value, is varied, the zero-cross point is shifted, which may also cause an error in the converted rotational angle.

Known techniques regarding a phase detection circuit are disclosed in Patent Documents 3-6. The known techniques disclosed in Patent Documents 3-6 have problems that the circuit scale of a waveform generation circuit is increased due to the necessity of using two waveform generation circuits and generating a SIN wave. Patent Document 1 also has a similar problem because the rotational angle is estimated based on the same principle.

To overcome the above-mentioned problems in the related art, a phase detection circuit according to one major aspect of the present invention comprises a multiplier for multiplying an input signal by a reference signal and outputting a first signal, an integration circuit for integrating the first signal and outputting a second signal, a phase estimation circuit for estimating phase information based on the second signal, and a reference signal generation circuit for generating the reference signal based on the estimated phase information.

Preferably, the phase detection circuit of the present invention detects the phase information based on information representing an entire waveform of the input signal.

According to another major aspect, the present invention provides a resolver/digital converter for performing digital conversion of an analog signal by obtaining a digital angle output ($\phi$) based on rotation detected signals $\sin\theta \cdot f(t)$ and $\cos\theta \cdot f(t)$ (where $f(t)$ is an excitation component) outputted from rotation sensors, wherein the rotation detected signals $\sin\theta \cdot f(t)$ and $\cos\theta \cdot f(t)$ are introduced to a multiplier to obtains a first output signal $\sin(\theta-\phi) \cdot f(t)$ through respective multiplications of $\sin\theta \cdot f(t)$ and $\cos\theta \cdot f(t)$ by $\cos\phi$ and $\sin\phi$ which are obtained from the digital angle output ($\phi$), the first output signal $\sin(\theta-\phi) \cdot f(t)$ is subjected to synchronous detection to remove the excitation component $f(t)$, thereby obtaining a second output signal $\sin(\theta-\phi)$ as a control deviation $\epsilon$, and the digital angle output ($\phi$) is obtained based on determination as to whether the control deviation $\epsilon$ is positive or negative, $\sin\phi$ and $\cos\phi$ being each a $\Delta\Sigma$-modulation signal.

According to the present invention, it is possible to obtain a small-sized and low-cost resolver/digital converter which has noise immunity and is less affected by variation of a center voltage of a resolver signal, i.e., a bias value.

DESCRIPTION OF THE PREFERRED EMBODIMENTS

An embodiment of the present invention will be described in detail below with reference to the drawings.

Figure 1:
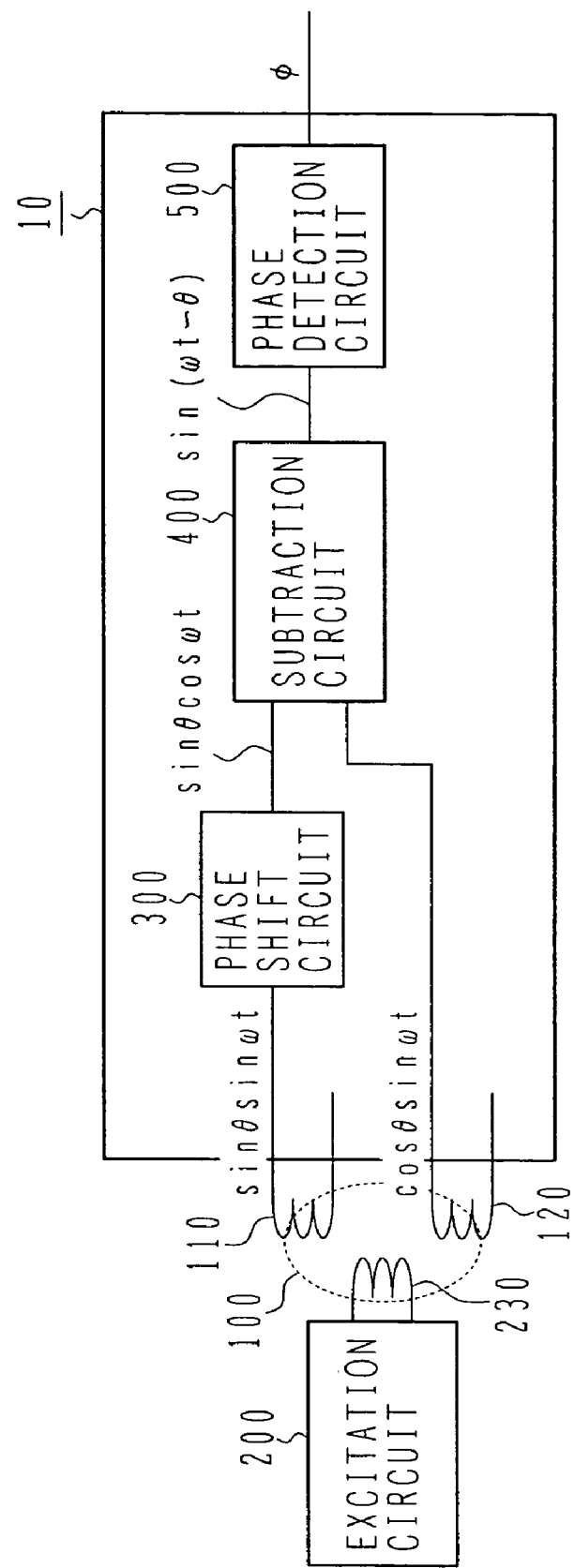
FIG. 1 is a block diagram showing the entirety of a resolver/digital converter 500 according to the present invention.

FIG. 1 is a block diagram showing the entirety of a resolver/digital converter according to the present invention. An excitation circuit 200 outputs an excitation signal 230 to a resolver 100. A SIN output 110 and a COS output 120 of the resolver 100 are inputted to a resolver/digital converter 10. A phase shift circuit 300 delays the phase of the SIN output 110 by 90°, and a subtraction circuit 400 subtracts the delayed SIN output 110 from the COS output 120. A phase detection circuit 500 detects the phase of the subtraction result and outputs an estimated value $\phi$ of a rotational angle $\theta$.

Here, the SIN output 110 and the COS output 120 of the resolver 100 are expressed respectively by $\sin\theta \sin\omega t$ and $\cos\theta \sin\omega t$ ($\theta$: rotational angle (electrical angle) of the resolver), $\omega$: angular velocity ($2\pi f$, f: frequency of the resolver excitation signal), and t: time).

A signal obtained by advancing 90° the phase of the SIN output 110 by the phase shift circuit 300 is expressed by $\sin\theta \cos\omega t$. Therefore, the subtraction executed in the subtraction circuit 400 is expressed by:

$$\cos\theta \sin\omega t - \sin\theta \cos\omega t = \sin(\omega t - \theta)$$

Accordingly, the estimated value $\phi$ of the rotational angle $\theta$ can be obtained by detecting the phase of the subtraction result by the phase detection circuit 500.

Also, a signal obtained by delaying 90° the phase of the SIN output 110 by the phase shift circuit 300 is expressed by $-\sin\theta \cos\omega t$. Accordingly, the estimated value $\phi$ of the rotational angle $\theta$ can be obtained by reversing a sign of the signal, executing the subtraction, and detecting the phase of the subtraction result.

Figure 2:
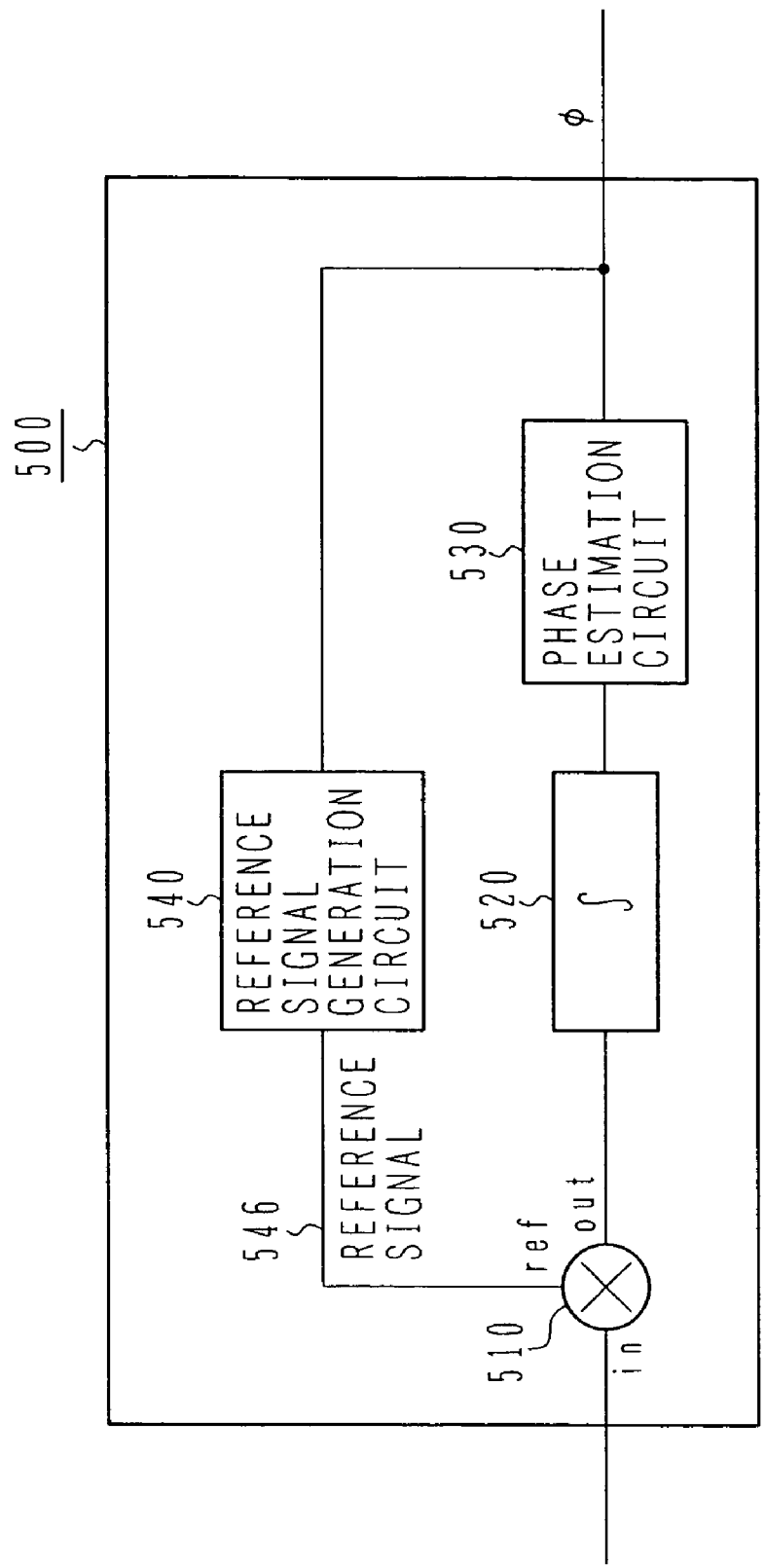
FIG. 2 is a block diagram showing an example of a phase detection circuit 500.
Figure 3:
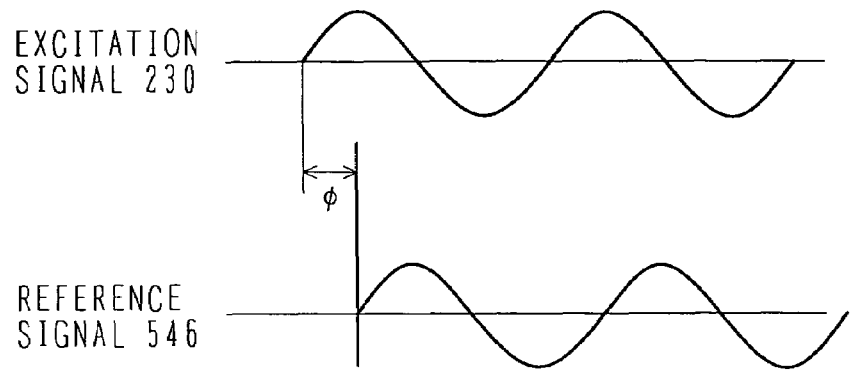
FIG. 3 is a chart showing an example of the phase relationship between an excitation signal 230 and a reference signal 546.

FIG. 2 is a block diagram showing an example of the phase detection circuit 500. A multiplier 510 multiplies an input signal (in) by a reference signal 546. The multiplication result (out) is inputted to an integration circuit 520, and an output of the integration circuit 520 is inputted to the phase estimation circuit 530. The phase difference $\phi$ estimated by the phase estimation circuit 530 is outputted as an estimated value of $\theta$ and is inputted to the reference signal generation circuit 540. The reference signal generation circuit 540 outputs the reference signal 546 having the phase shifted $\phi$ from the excitation signal 230, as shown in FIG. 3.

By thus multiplying the input signal (in) by the reference signal 546 in the multiplier 510 and integrating the multiplication result (out) in the integration circuit 520, it is possible to obtain a correlation function value between the input signal (in) and the reference signal 546. This process is based on such a property that, as shown in FIG. 4, when the input signal (in) and the reference signal 546 have the same frequency, the correlation function value is changed depending on the phase difference between them, and when their phases are matched with each other, the correlation function value is maximized.

In other words, by converging φ in the phase estimation circuit 530 while searching for a value at which the correlation function value is maximized, the searched value provides an estimated value of the phase θ. Also, because a noise component has a different cycle from that of the reference signal or the excitation signal, a correlation function value between them is substantially zero and does not affect the converging operation. Thus, the influence of noise upon the phase detection result φ can be greatly reduced. Similarly, because a deviation of center voltage of the resolver signal, i.e., a deviation of the bias voltage, becomes a DC component and has a different cycle from that of the reference signal or the excitation signal, a correlation function value between them is substantially zero and does not affect the converging operation. Thus, the influence of the deviation of center voltage of the resolver signal, i.e., the deviation of bias value, upon the phase detection result φ can be greatly reduced.

Figure 5:
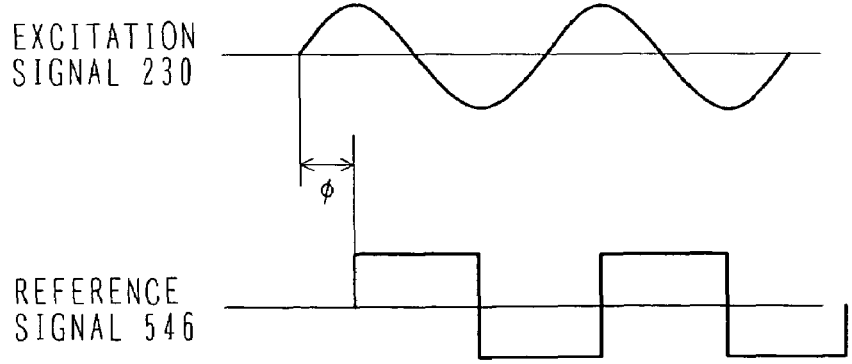
FIG. 5 is a chart showing an example in which the reference signal 546 is a rectangular wave.
Figure 6:
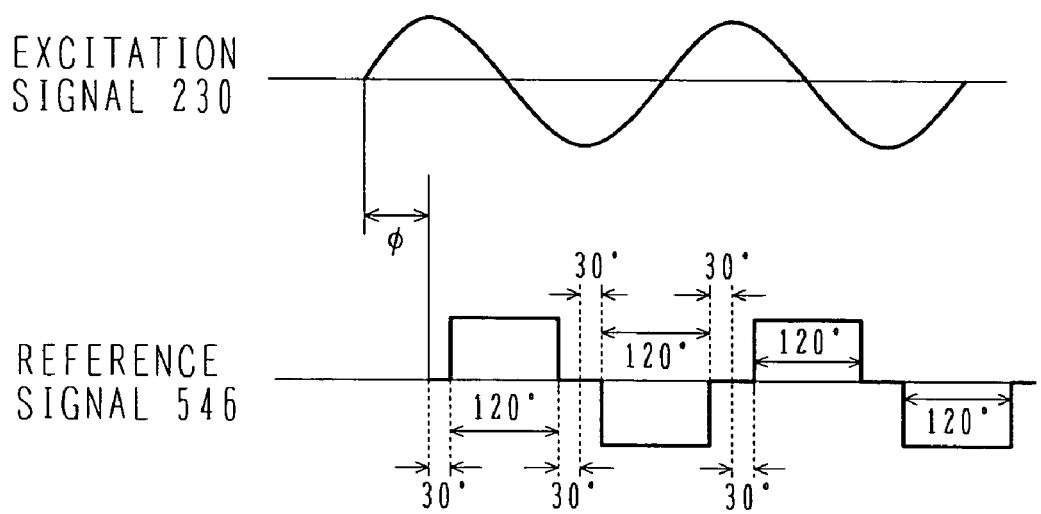
FIG. 6 is a chart showing an example in which the reference signal 546 is a rectangular wave with a width of 120°.

The input signal is here a sine wave, but the reference signal 546 is not always limited to a sine wave and it may be a rectangular wave as shown in FIG. 5. Alternatively, the reference signal 546 may be a rectangular wave with a width of 120° as shown in FIG. 6.

Figure 4:
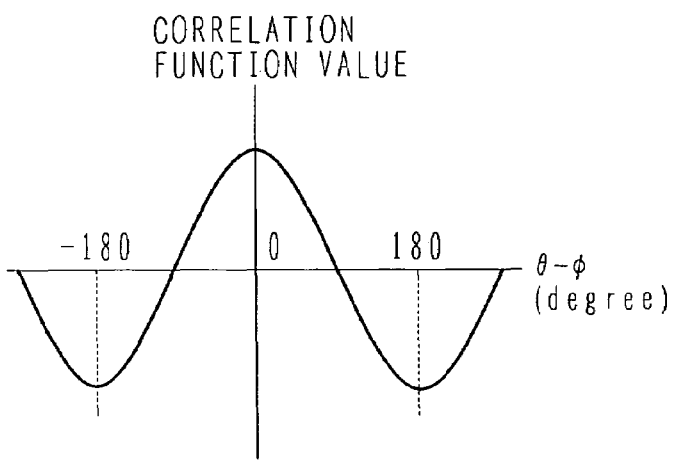
FIG. 4 is a chart showing an example of the relationship between a phase difference and a correlation function value.
Figure 7:
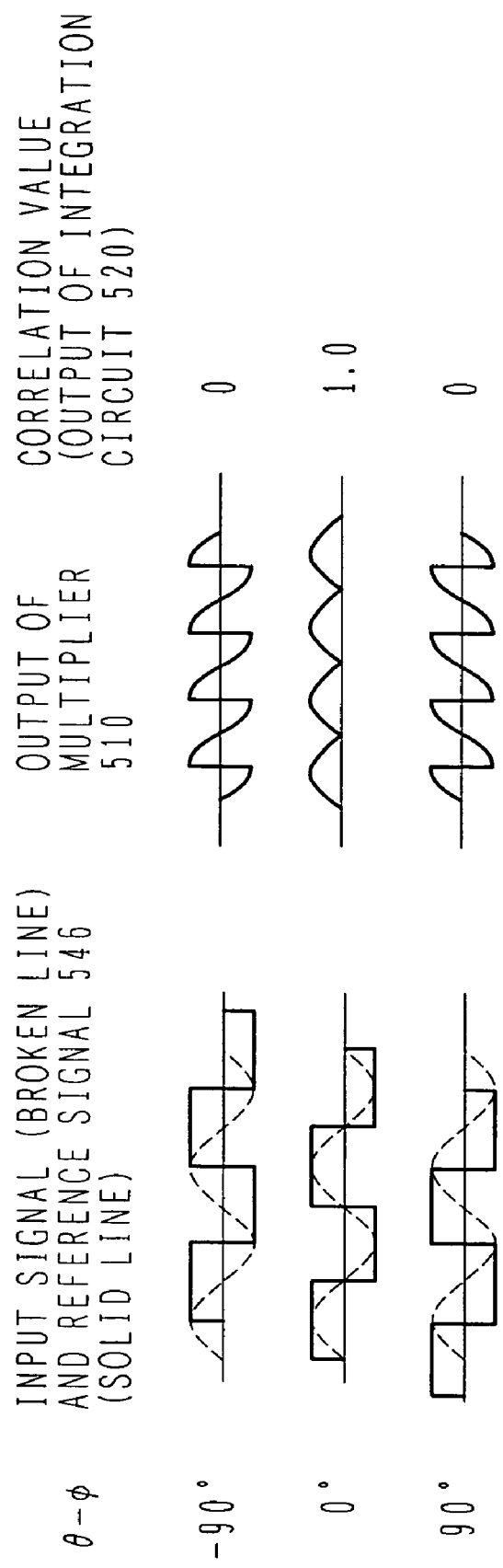
FIG. 7 is a chart showing examples of waveforms of an input signal, a reference signal, a multiplier output, and a correlation function value.

FIG. 7 shows respective signals on an assumption of the phase difference between θ and φ being −90°, 0° and 90° when the reference signal in the example shown in FIGS. 2-4 is a rectangular wave as shown in FIG. 5. In FIG. 7, a broken line in the left side represents the input signal and a solid line represents the reference signal 546 for each of the phase differences. Waveform at the center in FIG. 7 represents the output of the multiplier 510, and the right side represents the correlation function value (i.e., the output of the integration circuit 520).

When the reference signal 546 is a rectangular wave, the difference in noise immunity in comparison with that in the case of the reference signal being a sine wave is slight as described below, while the reference signal generation circuit 540 and the multiplier 510 can be simplified to a large extent, thus resulting in a reduction of size and cost of the circuit.

When the reference signal 546 is a rectangular wave with a width of 120°, the reference signal generation circuit 540 and the multiplier 510 are somewhat more complicated than the case of the reference signal being a rectangular wave, while the noise immunity is somewhat improved correspondingly.

Comparison in the noise immunity, i.e., the S/N improving effect, is made below among the cases where the reference signal is a sine wave, a rectangular wave, and a rectangular wave with a width of 120°.

Assuming that the S/N of the input signal is k, the amplitude of the input signal is 1 for the sake of simplification, and the amplitude of noise is 1/k, the S/N contained in the correlation function value is estimated.

(1) Case of Reference Signal being Sine Wave

A target signal component including no noise, i.e., an integrated value (over n cycles) of a synchronized signal component, is expressed by the following formula:

$$S=n\cdot\int_0^{2\pi}\sin x\cdot\sin x\,dx=n\cdot\int_0^{2\pi}\{1/2-(\cos 2x)/2\}dx=n\pi \quad (1)$$

A noise component for the target signal component, i.e., integrated value (over n cycles) of a non-synchronized signal component, is expressed by the following formula on an assumption that the noise component is statistically random:

$$N=\mathrm{SQRT}(\int_0^{2\pi}\sin^2 x\,dx)/k=\mathrm{SQRT}(n\pi)/k \quad (2)$$

By dividing the formula (1) by the formula (2), the S/N is obtained as follows:

$$S/N=\mathrm{SQRT}(\pi/n)=1.772\cdot k/\mathrm{SQRT}(n) \quad (3)$$

Consequently, the S/N improving effect is represented by 1.772/SQRT(n).

(2) Case of Reference Signal being Rectangular Wave

As in the above case, a target signal component including no noise, i.e., an integrated value (over n cycles) of a synchronized signal component, is expressed by the following formula:

$$S=n\cdot\int_0^{2\pi}|\sin x|dx=4n \quad (4)$$

A noise component for the target signal component, i.e., an integrated value (over n cycles) of a non-synchronized signal component, is expressed by the following formula:

$$N=\mathrm{SQRT}(\int_0^{2\pi}1^2 dx)/k=\mathrm{SQRT}(2n\pi)/k \quad (5)$$

By dividing the formula (4) by the formula (5), the S/N is obtained as follows:

$$S/N=4/\mathrm{SQRT}(2n\pi)=1.596\cdot k/\mathrm{SQRT}(n) \quad (6)$$

Consequently, the S/N improving effect is represented by 1.596/SQRT(n).

(3) Case of Reference Signal being Rectangular Wave with Width of 120°

As in the above case, a target signal component including no noise, i.e., an integrated value (over n cycles) of a synchronized signal component, is expressed by the following formula:

$$S=n\cdot\int_{\pi/6}^{5\pi/6}|\sin x|dx+\int_{7\pi/6}^{11\pi/6}|\sin x|dx=2\mathrm{SQRT}(3)n \quad (7)$$

A noise component for the target signal component, i.e., an integrated value (over n cycles) of a non-synchronized signal component, is expressed by the following formula:

$$N=\mathrm{SQRT}(\int_{\pi/6}^{5\pi/6}1^2 dx+\int_{7\pi/6}^{11\pi/6}1^2 dx)/k=\mathrm{SQRT}(4n\pi/3)/k \quad (8)$$

By dividing the formula (7) by the formula (8), the S/N is obtained as follows:

$$S/N=3/\mathrm{SQRT}(n\pi)=1.692\cdot k/\mathrm{SQRT}(n) \quad (9)$$

Consequently, the S/N improving effect is represented by 1.692/SQRT(n).

As seen from the above discussion, the S/N improving effect in the case of the reference signal being a sine wave is just 1.11 times, i.e., +0.9 dB, in comparison with the case of the reference signal being a rectangular wave. Taking into account a simplification of the circuit and a reduction of the cost, therefore, the use of a rectangular wave is more preferable.

The process of obtaining correlation between signals having the same cycle, i.e., the process of improving the S/N by synchronous detection, can also be explained as follows from the viewpoint of frequency region. Looking from the viewpoint of the frequency region, the operation of multiplying the input signal by the reference signal can be regarded as frequency conversion by the heterodyne process. The difference between the reference signal and a component of the input signal, which has the same frequency as the reference signal, is subjected to the heterodyne process (also called "homodyne" because of the process on the same-frequency signals) and is obtained as a DC component. The step of passing the multiplication result through the integration circuit corresponds to the operation of taking out only the DC component. Accordingly, when the reference signal is a sine wave including no higher harmonics, a signal corresponding to a basic wave of the excitation signal and the noise component are both converted to a DC component. When the reference signal includes higher harmonic components, noise components of frequencies corresponding to the higher harmonics of the excitation signal are also converted to the DC component, and therefore the S/N is deteriorated.

As seen from the above discussion, the deterioration of S/N in the case of the reference signal being a rectangular wave is attributable to the influence of noise corresponding to higher harmonic components of the target signal which are contained in the input signal. In other words, correlation components between those noise components and higher harmonic components of the rectangular wave are included in an output of a correlator. Therefore, the deterioration of S/N can be suppressed by inserting a proper filter for the input signal and removing components corresponding to the higher harmonic components of the target signal. Assuming the frequency of the target signal (excitation signal) to be 20 kHz, for example, the frequency of the rectangular wave is also 20 kHz. A rectangular wave being symmetrical in the vertical direction does not have even-order higher harmonic components, and has only odd-order higher harmonic components. Accordingly, the most dominant higher harmonic component having the lowest frequency, i.e., maximum energy, is a third higher harmonic wave with frequency of 60 kHz. Thus, by inserting, for the input signal, a filter capable of removing the components of not lower than 60 kHz, it is possible to avoid the deterioration of S/N which is caused in the case of the reference signal being a rectangular wave.

Also, when the rectangular wave with a width of 120° is used as the reference signal, the S/N improving effect is increased 1.06 times, i.e., +0.5 dB, in comparison with the case of the reference signal being a rectangular wave in exchange for a slight increase of the circuit scale.

The rectangular wave with a width of 120° is featured in not having a third higher harmonic wave, and the most dominant higher harmonic component having the lowest frequency, i.e., maximum energy, is a fifth higher harmonic wave with frequency of 100 kHz. Thus, by inserting, for the input signal, a filter capable of removing the components of not lower than 100 kHz, it is possible to avoid the deterioration of S/N which is caused in the case of the reference signal being a rectangular wave with a width of 120°. In other words, the cutoff frequency is higher about twice that in the case of the reference signal being a rectangular wave, and the deterioration of S/N can be avoided by a simpler filter.

When the integration circuit 520 is a complete integration circuit performing the integration over the entire frequency region, it is affected by the past history and therefore requires the reset function. On the other hand, when an imperfect integration circuit performing the integration in the frequency region of not lower than particular frequency, i.e., a low-pass filter, is used, the influence of the past history is reduced with the lapse of time. Therefore, the integration circuit 520 is preferably a low-pass filter in taking the advantages that the reset function is not required and simplification of the circuit is resulted. Also, since the output of the multiplication circuit 510 contains, in particular, a component having frequency twice that of the excitation signal 230 in a large amount, it is particularly effective to use a notch filter which is capable of attenuating the component having frequency twice that of the excitation signal 230.

Further, when a digital signal obtained through conversion in an A/D converter is subjected to signal processing in a digital circuit, using a comb-type filter (moving average filter) to attenuate the above-mentioned frequency component is particularly effective and is easy to realize. More specifically, assuming sampling frequency to be fs, the comb-type filter (moving average filter) for taking a moving average for m samplings has a portion (notch) where a gain is sharply reduced at particular frequency equal to the integer time of fs/m. Accordingly, when fs is n times the frequency of the excitation signal 230, a frequency characteristic having a lowest-frequency notch at the frequency twice that of the excitation signal 230 can be realized by setting n/m to be 2 (i.e., n/m=2).

Figure 8:
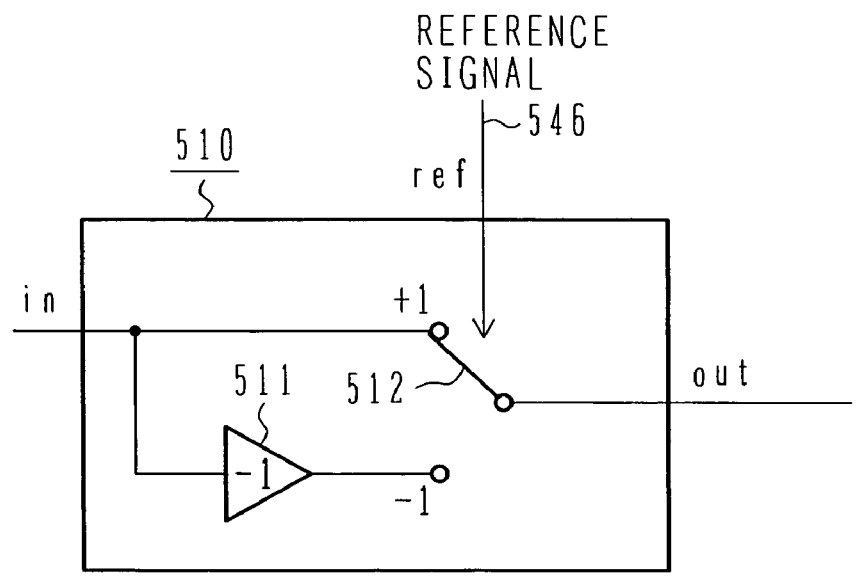
FIG. 8 is a diagram showing an example of a multiplier 510 when the reference signal 546 has a binary value.

FIG. 8 shows an example of the multiplier 510 when the reference signal 546 has a binary value of +1 and −1. The input signal (in) is inputted to an inverted amplifier 511. A switch 512 switches over the input signal (in) and an output of the inverted amplifier 511 in accordance with the reference signal 546 inputted to a terminal (ref), thereby outputting the selected one to a terminal (out). When the reference signal 546 is +1, the switch 512 outputs the input signal (in) to the terminal (out). When the reference signal 546 is −1, the switch 512 outputs the output of the inverted amplifier 511 to terminal (out). With that operation, the multiplier 510 can output the value resulting from multiplying the input signal (in) by the reference signal 546 to the terminal (out).

Figure 9:
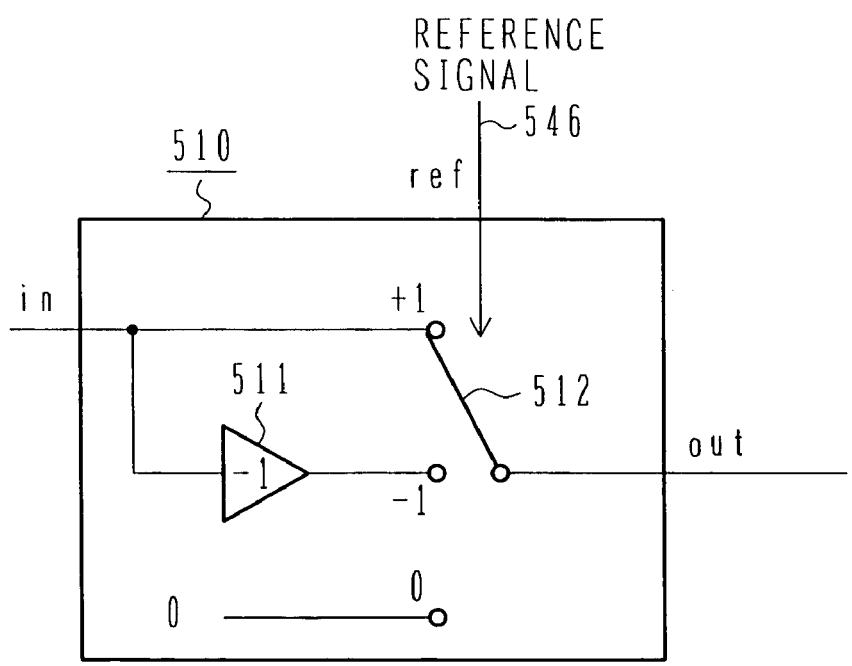
FIG. 9 is a diagram showing another example of the multiplier 510 when the reference signal 546 has a ternary value.

FIG. 9 shows another example of the multiplier 510 when the reference signal 546 is a rectangular wave with a width of 120° shown in FIG. 6, i.e., it has a ternary value of +1, 0 and −1. The input signal (in) is inputted to an inverted amplifier 511. A switch 512 switches over the input signal (in), an output of the inverted amplifier 511, and a signal level corresponding to 0 in accordance with the reference signal 546 inputted to a terminal (ref), thereby outputting the selected one to a terminal (out). When the reference signal 546 is +1, the switch 512 outputs the input signal (in) to the terminal (out). When the reference signal 546 is −1, the switch 512 outputs the output of the inverted amplifier 511 to terminal (out). When the reference signal 546 is 0, the switch 512 outputs the signal level corresponding to 0. With that operation, the multiplier 510 can output the value resulting from multiplying the input signal (in) by the reference signal 546 to the terminal (out).

Figure 10:
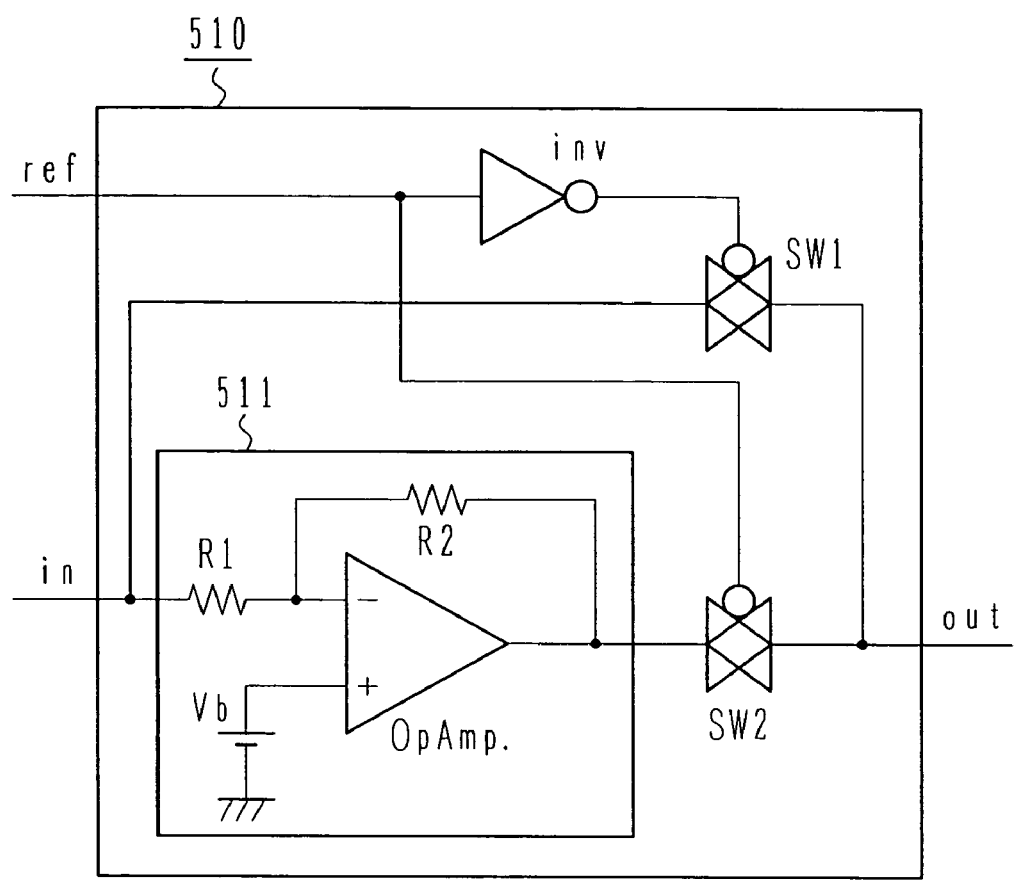
FIG. 10 is a detailed diagram of the multiplier 510 shown in FIG. 8.

FIG. 10 is a detailed diagram of the multiplier 510 when the reference signal 546 has a binary value of +1 and −1. An operational amplifier OpAmp and resistors R1 and R2 constitute the inverted amplifier 511. Vb represents the center voltage of the signal, i.e., the bias voltage. An inverter (inv) and analog switches SW1 and SW2 constitute the switch 512. When the reference signal 546 inputted to the terminal (ref) is H (+1), SW1 is turned on and SW2 is turned off, whereby the input signal (in) is outputted to the terminal (out) without being inverted. When the reference signal 546 is L (−1), SW1 is turned off and SW2 is turned on, whereby the input signal (in) is outputted to the terminal (out) after being inverted through the inverted amplifier 511.

Figure 11:
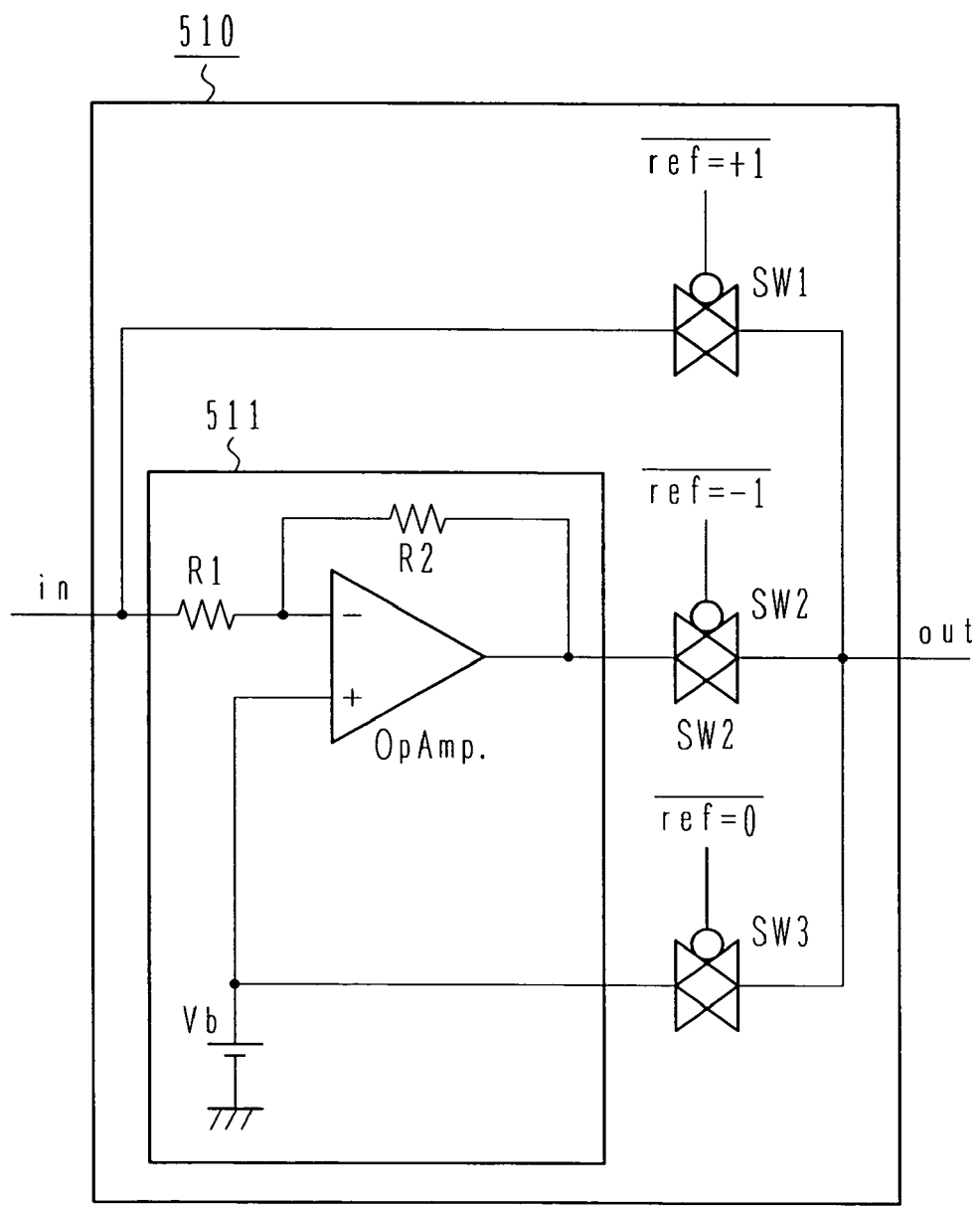
FIG. 11 is a detailed diagram of the multiplier 510 shown in FIG. 9.

FIG. 11 is a detailed diagram of the multiplier 510 when the reference signal 546 is a rectangular wave with a width of 120° shown in FIG. 6, i.e., it has a ternary value of +1, 0 and −1. When the reference signal 546 inputted to the terminal (ref) is +1, SW1 is turned on, SW2 is turned off, and SW3 is turned off, whereby the input signal (in) is outputted to the terminal (out) without being inverted. When the reference signal 546 is −1, SW1 is turned off, SW2 is turned on, and SW3 is turned off, whereby the input signal (in) is outputted to the terminal (out) after being inverted through the inverted amplifier 511. When the reference signal 546 is 0, SW1 is turned off, SW2 is turned off, and SW3 is turned on, whereby the center voltage of the signal, i.e., the bias voltage Vb, is outputted to the terminal (out).

Figure 12:
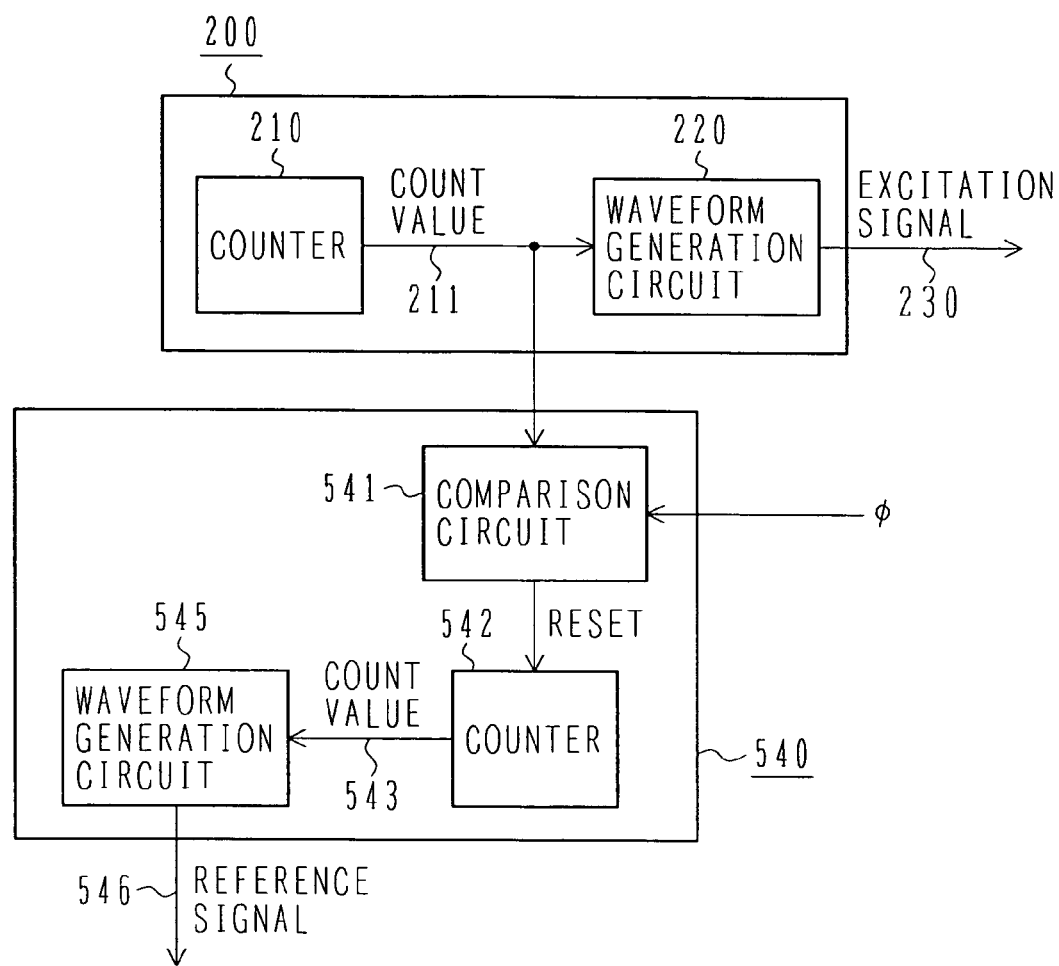
FIG. 12 is a block diagram showing an example of an excitation circuit 200 and a reference signal generation circuit 540.

FIG. 12 shows an example of the excitation circuit 200 and the reference signal generation circuit 540. A counter 210 increments a count value 211 for each lapse of a certain time in accordance with a clock. When the count value 211 reaches a value corresponding to one cycle of the excitation signal 230, the count value 211 is reset and the counter 210 starts to count again from 0. In the excitation circuit 200, a waveform generation circuit 220 generates the excitation signal 230 in accordance with the count value 211 of the counter 210. Because the excitation signal 230 is a function of sin ωt and time t, the excitation signal 230 is generated as a signal having a value of sin ωt in accordance with the count value 211 representing the time t. Also, because the quantization noise can be removed by passing the signal through a low-pass filter, resolution for a value of sin ωt is not required to be so high. Further, by using a ΔΣ-type A/D converter as the waveform generation circuit 220, it is possible to distribute the quantization noise over a higher frequency range with noise shaping, and to further reduce the influence of the quantization noise.

In the reference signal generation circuit 540, a waveform generation circuit 545 generates the reference signal 546 in accordance with a count value 543 of a counter 542 in a similar manner. When a comparison circuit 541 determines that the count value 211 of the counter 210 reaches a value corresponding to φ, the counter 542 is reset. Accordingly, the counter 542 is operated with a delay of φ from the counter 210, and the phase of the reference signal 546 is delayed φ from that of the excitation signal 230.

Figure 13:
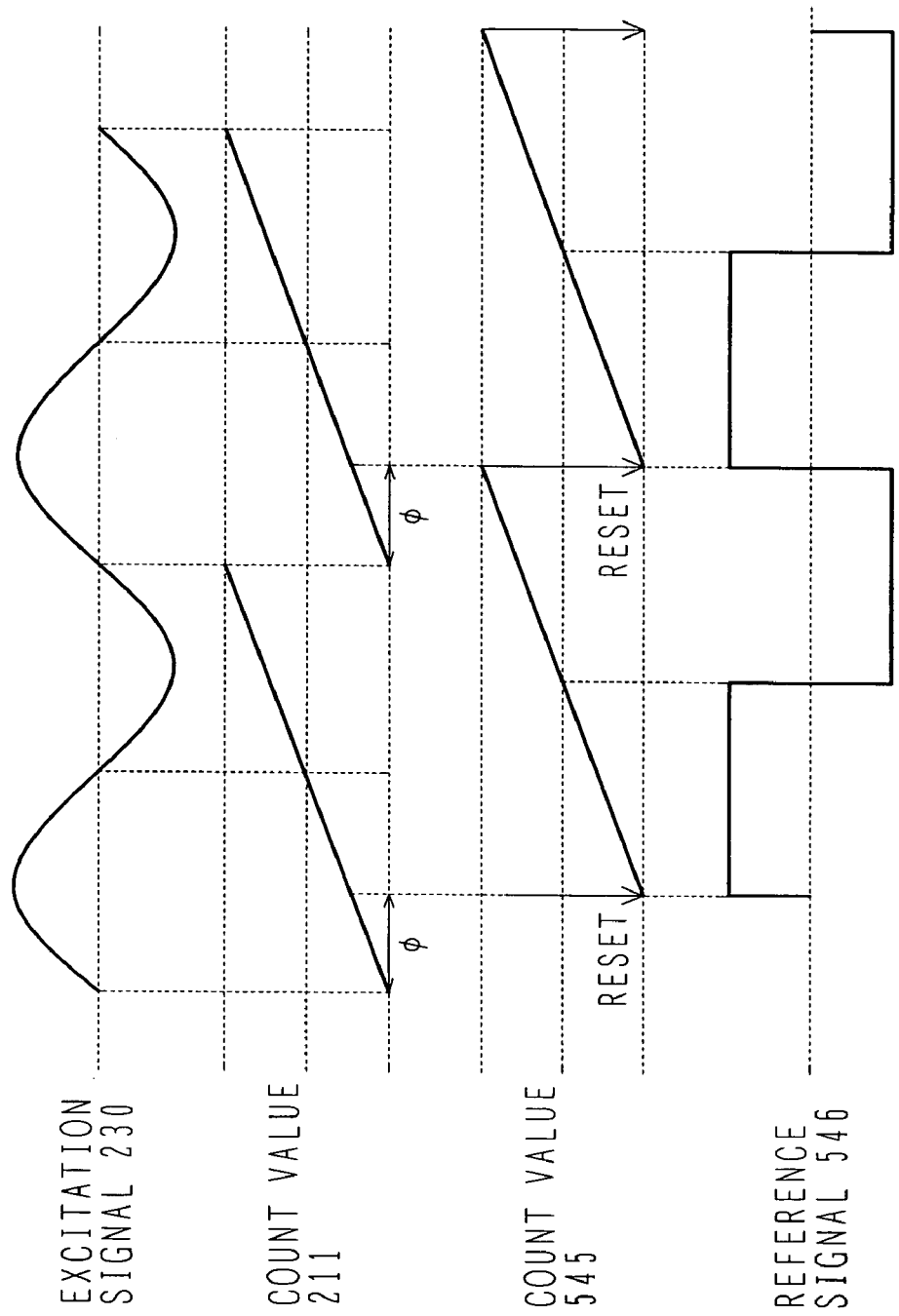
FIG. 13 is a chart showing an example of operation of the reference signal generation circuit 540.
Figure 14:
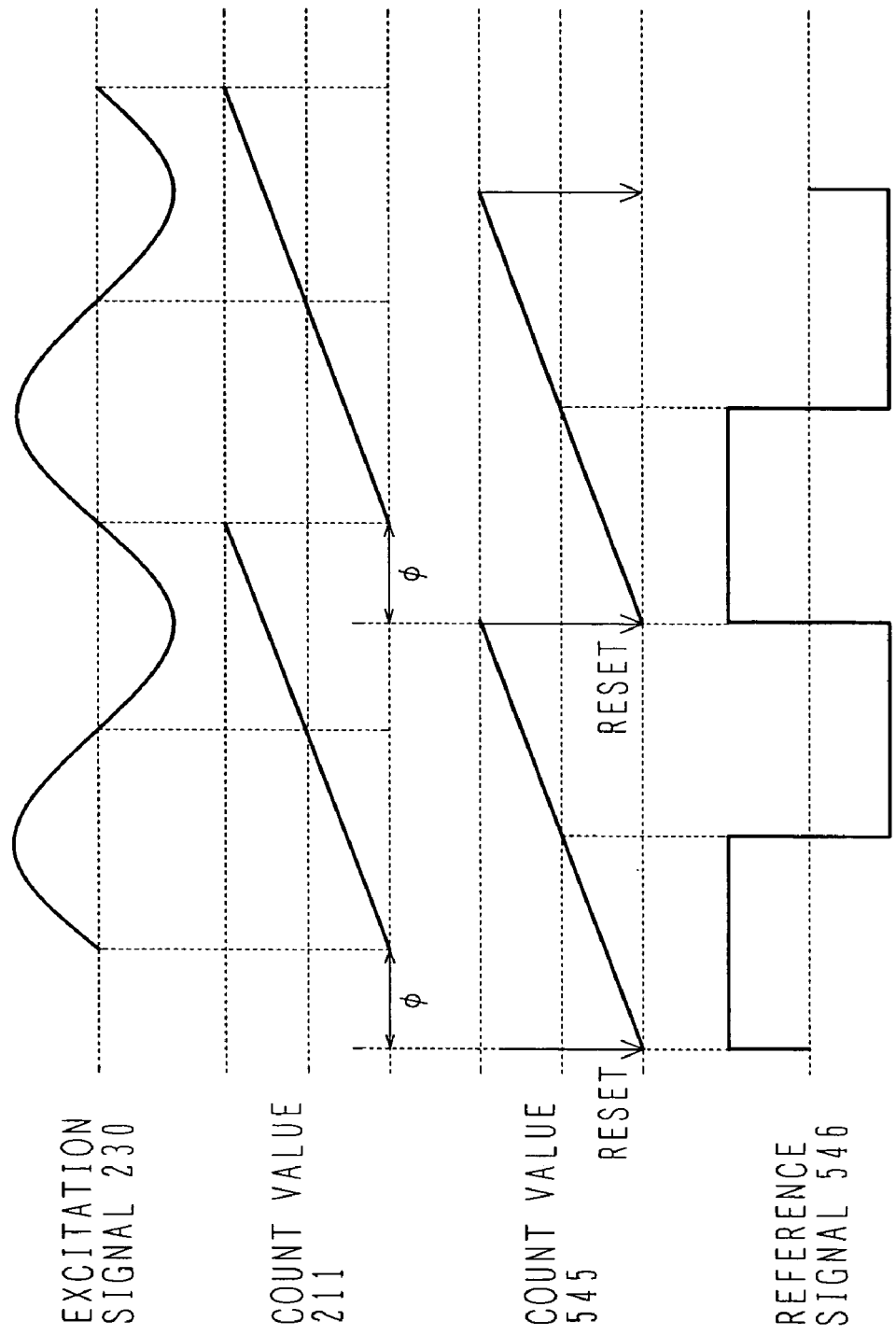
FIG. 14 is a chart showing another example of operation of the reference signal generation circuit 540.

FIGS. 13 and 14 show examples of operation of the reference signal generation circuit 540. FIG. 13 shows the example of operation in which the reference signal 546 is delayed from the excitation signal 230. In the example of FIG. 13, the counter 542 for generating the reference signal 546 is reset when the count value 211 of the counter 210 for generating the excitation signal 230 reaches the value corresponding to the phase φ. With that operation, the counter 542 can be operated with a delay of time corresponding to the phase φ from the counter 210, and the reference signal 546 can be delayed from the excitation signal 230 by the phase φ.

FIG. 14 shows the example of operation in which the reference signal 546 is advanced from the excitation signal 230. In the example of FIG. 14, the counter 542 for generating the reference signal 546 is reset when the count value 211 of the counter 210 for generating the excitation signal 230 reaches a value smaller than the value corresponding to one cycle of the excitation signal 230 by a value corresponding to the phase φ. With that operation, the counter 542 can be operated with an advance of time corresponding to the phase φ from the counter 210, and the reference signal 546 can be advanced from the excitation signal 230 by the phase φ.

Figure 15:
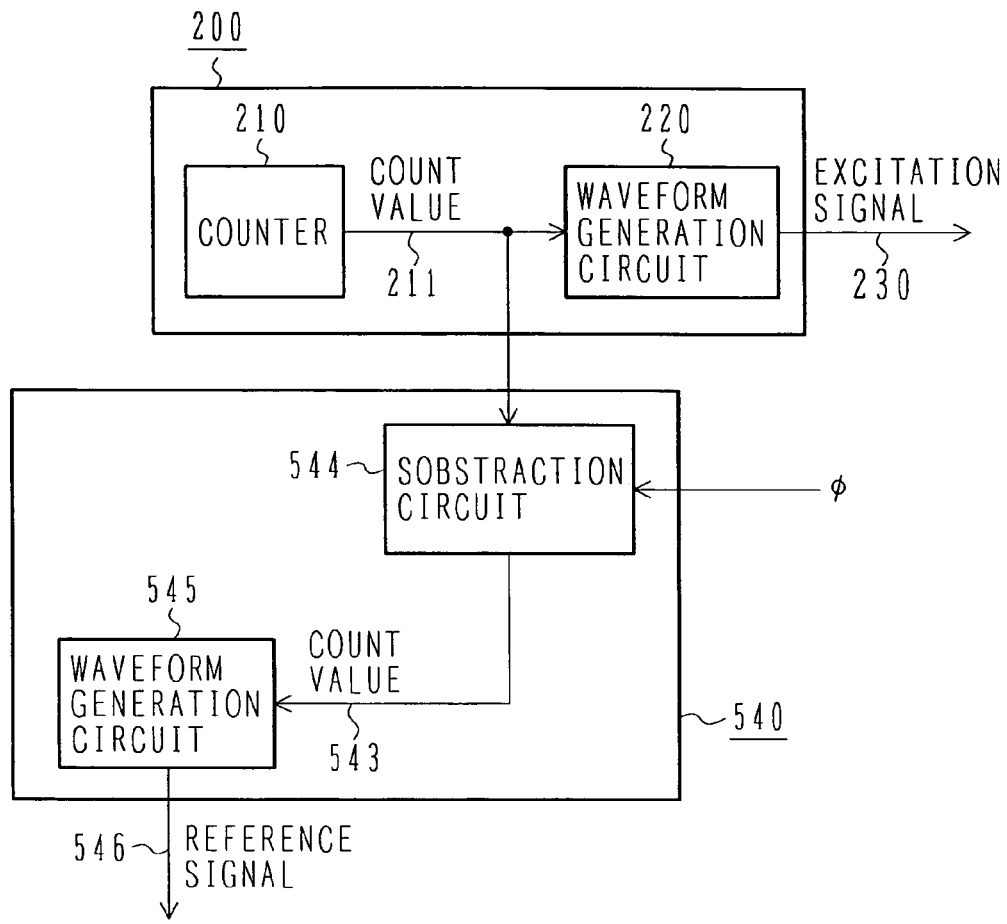
FIG. 15 is a block diagram showing another example of the excitation circuit 200 and the reference signal generation circuit 540.

FIG. 15 shows another example of the reference signal generation circuit 540. In this example of the reference signal generation circuit 540, the waveform generation circuit 545 generates the reference signal 546 in accordance with a count value 543 which is obtained by subtracting φ from the count value 211 of the counter 210 in a subtraction circuit 544. Accordingly, the counter 542 is operated with a delay of φ from the counter 210, and the phase of the reference signal 546 is delayed φ from that of the excitation signal 230. In the example of FIG. 12, the counter 542 is reset when the comparison circuit 541 determines that the count value 211 of the counter 210 reaches the value corresponding to φ, and therefore the phase difference of the reference signal 546 can be updated only in units of cycle of the excitation signal 230. On the other hand, in the example of FIG. 15, the phase difference of the reference signal 546 is updated immediately upon update of φ. Thus, a useless time delay in a feedback loop of φ can be reduced, and a response of the feedback loop can be increased.

Additionally, in the case of the correlation function value being maximized when the phase difference between the reference signal 546 and the input signal (in) is 0, as shown in FIG. 4, the direction in which the value of φ should be increased or decreased when the phase difference is not 0, cannot be determined from the correlation function value. For that reason, a relatively complicated algorithm, such as a hill-climbing method or a steepest descent (ascent) method, is required in the phase estimation circuit 530 to search for φ at which the correlation function value is maximized.

Figure 16:
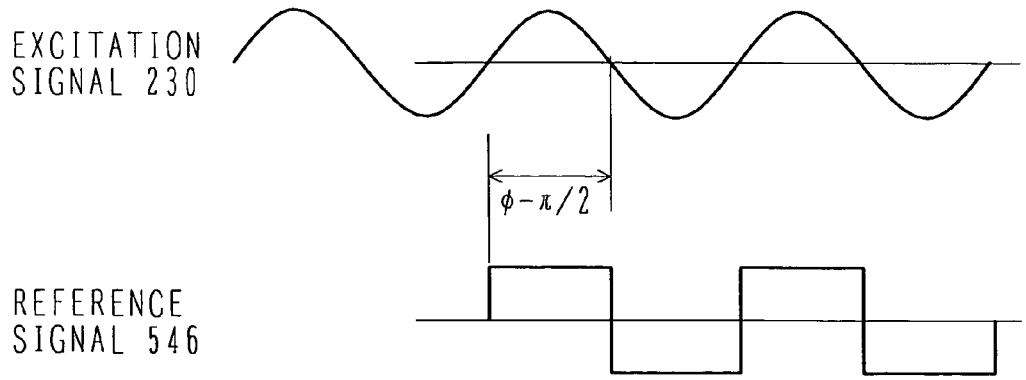
FIG. 16 is a chart showing another example of the phase relationship between an excitation signal 230 and a reference signal 546.
Figure 17:
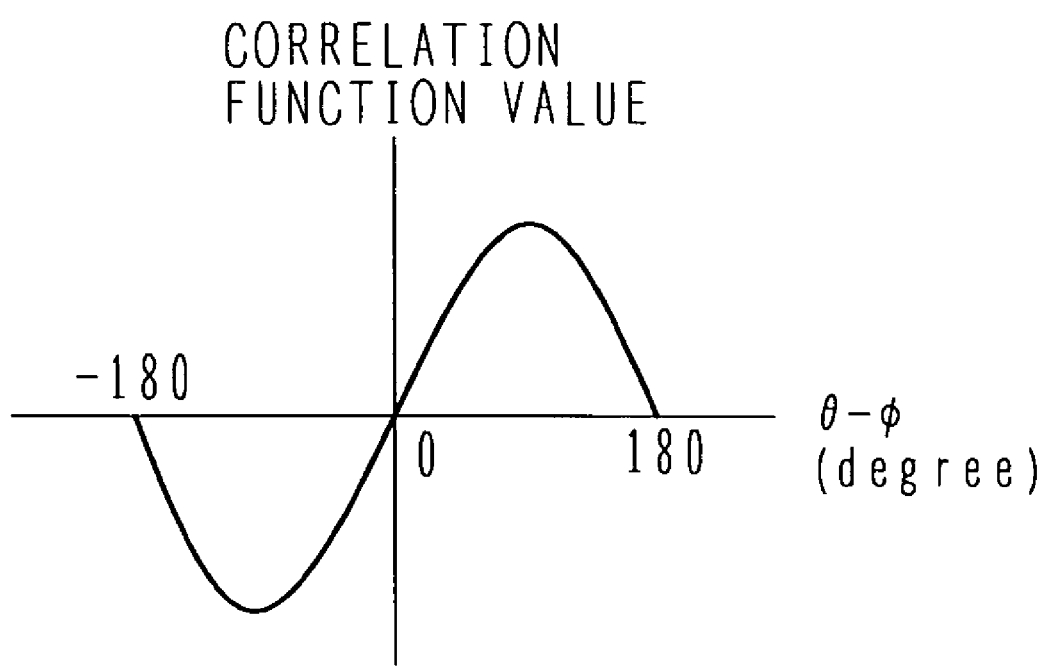
FIG. 17 is a chart showing another example of the relationship between a phase difference and a correlation function value.

Meanwhile, when the reference signal 546 generated by the reference signal generation circuit 540 is previously given with a phase offset of 90°, as shown in FIG. 16, the relationship of the phase difference between the reference signal 546 and the input signal (in) versus the correlation function value is shown as represented in FIG. 17. More specifically, when the phase difference between the reference signal 546 and the input signal (in) is 0, the correlation function value is 0. When the phase difference (θ−φ) is positive, the correlation function value is positive, and when the phase difference (θ−φ) is negative, the correlation function value is negative. In other words, whether the value of φ should be increased or decreased when the phase difference is not 0 can be determined depending on whether the correlation function value is positive or negative. Therefore, the phase difference can be made closer to 0 by increasing φ when the correlation function value is positive, and by decreasing φ when the correlation function value is negative. Thus, the converging operation can be performed until the phase difference becomes 0, by repeating the operation of increasing or decreasing the value of φ in the phase estimation circuit 530 depending on the polarity of the correlation function value.

Figure 18:
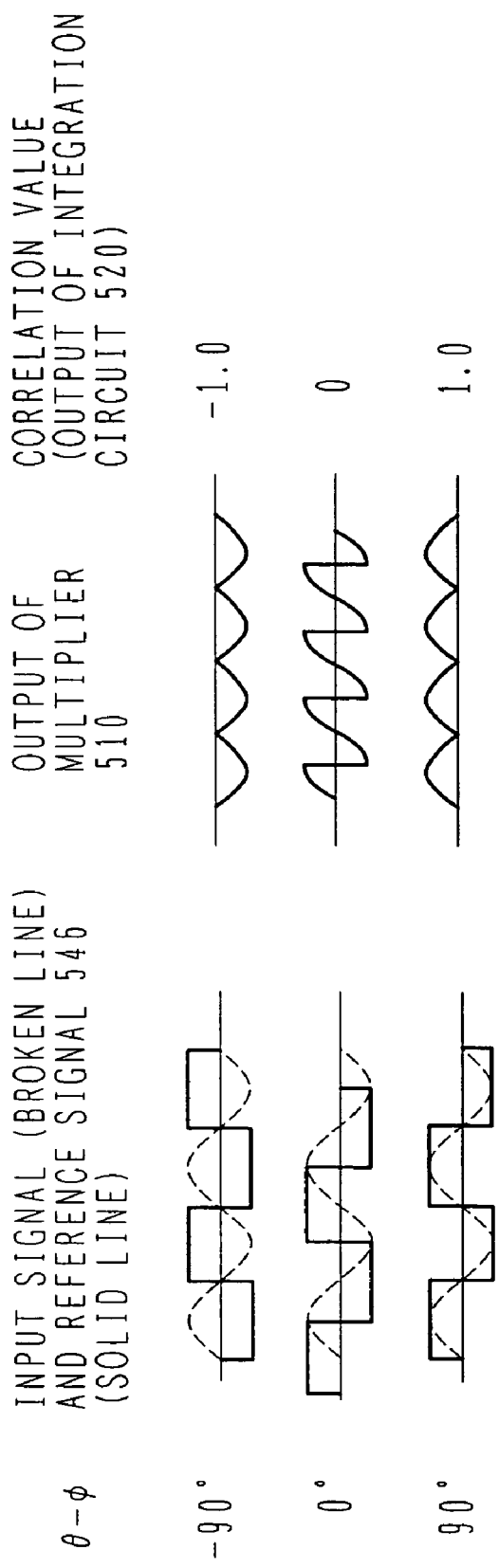
FIG. 18 is a chart showing other examples of waveforms of the input signal, the reference signal, the multiplier output, and the correlation function value.

FIG. 18 shows respective signals when the phase difference between θ and φ is −90°, 0° and 90° in the example shown in FIGS. 16 and 17. In FIG. 18, a broken line in the left side represents the input signal and a solid line represents the reference signal 546 for each of the phase differences. Waveform at the center in FIG. 18 represents the output of the multiplier 510, and the right side represents the correlation function value (i.e., the output of the integration circuit 520).

Figure 19:
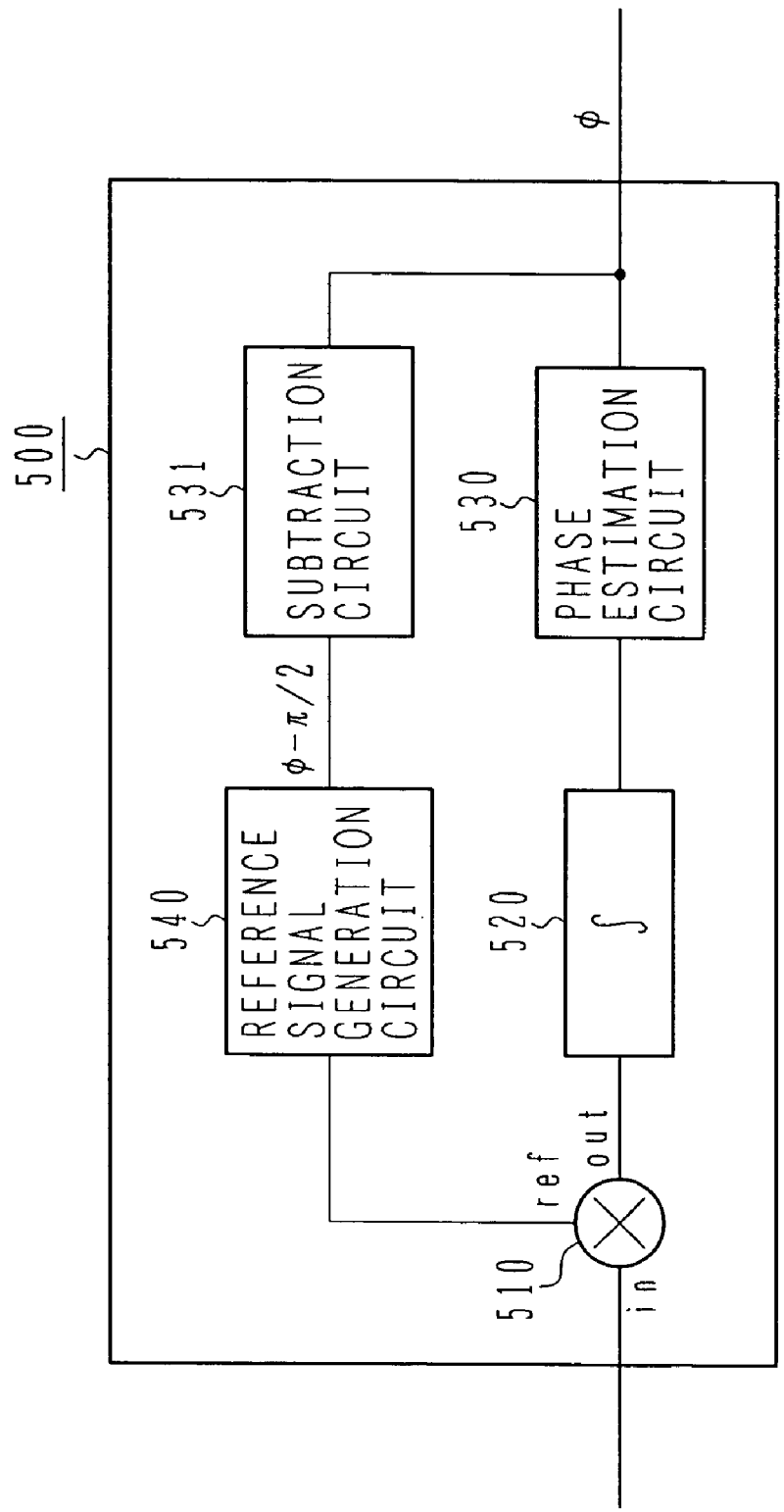
FIG. 19 is a block diagram showing another example of the phase detection circuit 500.
Figure 20:
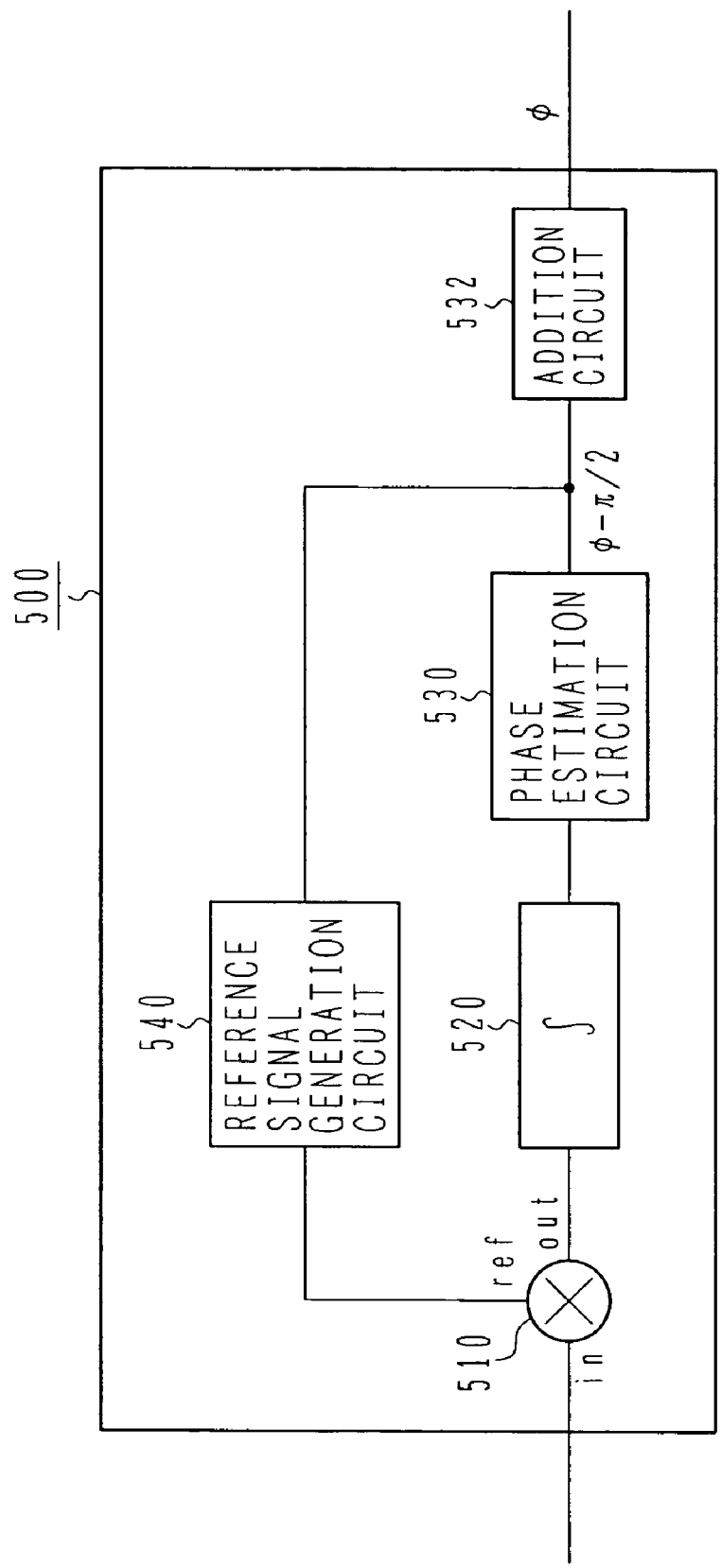
FIG. 20 is a block diagram showing still another example of the phase detection circuit 500.

FIGS. 19 and 20 show other examples of the phase detection circuit 500 for realizing the relationship between the phase difference and the correlation function value, which is shown FIGS. 16-18. In the example of FIG. 19, a phase offset of 90° is obtained by subtracting, in a subtraction circuit 531, π/2 from φ outputted from the phase estimation circuit 530, and by inputting the subtraction result to the reference signal generation circuit 540. As an alternative method, as shown in FIG. 20, the phase estimation circuit 530 may output a value given with an offset beforehand, i.e., φ−π/2, and an addition circuit 532 may remove the offset to produce φ as an output of the phase detection circuit 500.

In each of the circuits shown in FIGS. 19 and 20, the phase estimation circuit 530 is operated so as to increase the phase estimated value φ when the output of the integration circuit 520 is positive, and to decrease the phase estimated value φ when the output of the integration circuit 520 is negative; namely, it is operated to perform the operation of integrating the output of the integration circuit 520. Also, the phase estimation circuit 530 may be of the double integration type to eliminate a deviation in the feedback control in the case of rotary motion, and it may be of the triple integration type to eliminate a deviation in the feedback control in the case of accelerated motion. Further, a nonlinear element may be contained in the phase estimation circuit 530, as required, for an improvement of the converging operation with the feedback control.

In the examples of FIGS. 19 and 20, as in the above-described example, because a noise component has a different cycle from that of the reference signal or the excitation signal, the correlation function value between them is substantially zero and does not affect the converging operation. Thus, the influence of noise upon the phase detection result φ can be greatly reduced. Similarly, because a deviation of the center voltage of the resolver signal, i.e., a deviation of the bias voltage, becomes a DC component and has a different cycle from that of the reference signal or the excitation signal, a correlation function value between them is substantially zero and does not affect the converging operation. Thus, the influence of the deviation of center voltage of the resolver signal, i.e., the deviation of bias value, upon the phase detection result φ can be greatly reduced.

FIGS. 21-24 show examples of the phase detection circuit 500 having the abnormality detection function. In each of the examples shown in FIGS. 21-24, the output of the integration circuit 520 is compared with a preset threshold in a comparison circuit 550. If the comparison result is within a predetermined range, the output of the integration circuit 520 is determined to be normal. If the comparison result is outside the predetermined range, the output of the integration circuit 520 is determined to be abnormal and an abnormality detection signal 11 is turned on.

More specifically, in the example of FIG. 21, because the output of the integration circuit 520 takes a predetermined value in the normal state, the threshold for detecting an abnormality is set to have a certain width above and below the predetermined value at a center. With this example, since whether the phase of the reference signal 546 is able to follow the input signal is checked, it is possible to detect whether the operation of the phase detection circuit 500 is normal, and to detect whether the relationship between the signals 110 and 120 from the resolver 100, e.g., a relative amplitude ratio between them, is normal. For example, an abnormality of the signal caused by a layer short in coils of the resolver 100 can be detected.

Further, since the output of the integration circuit 520 reflects the amplitudes of the signals 110 and 120 from the resolver 100, it is possible to detect whether the absolute amplitudes of the signals 110 and 120 from the resolver 100 are normal. For example, a variation in amplitude of the excitation signal 230 caused by an abnormality in the excitation circuit 200 can be detected.

Figure 22:
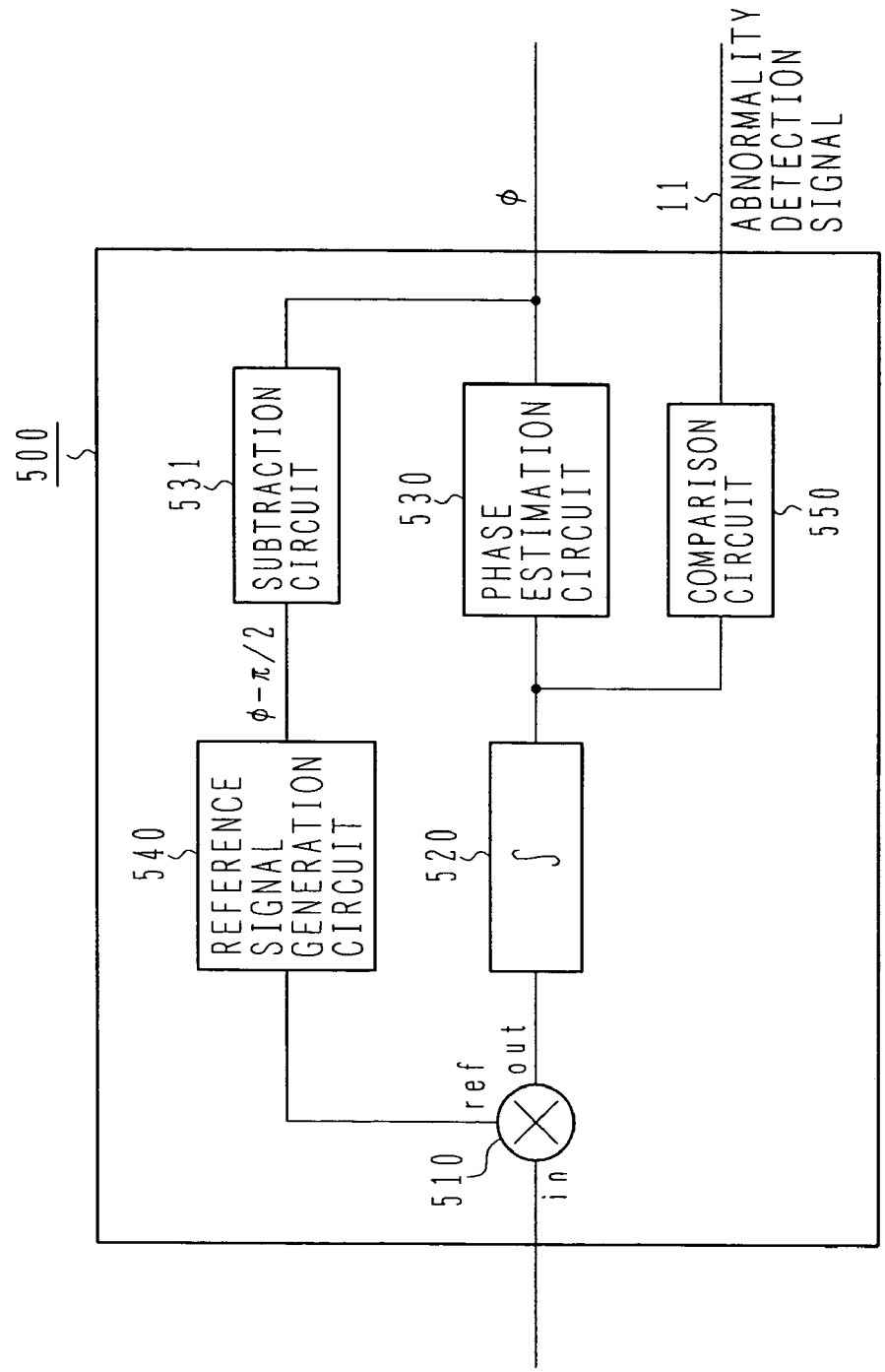
FIG. 22 is a block diagram showing another example of the phase detection circuit 500 having the abnormality detection function.
Figure 23:
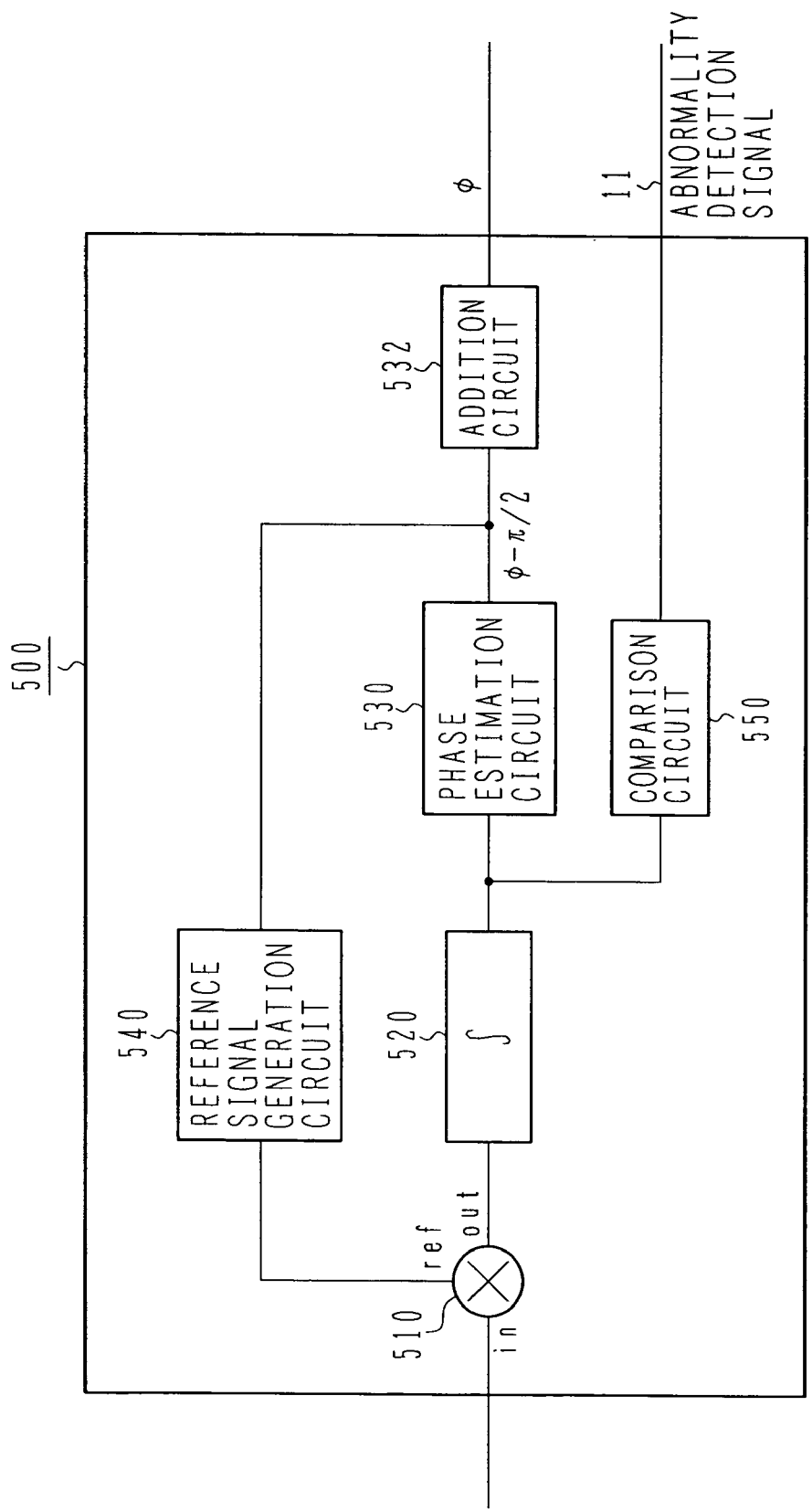
FIG. 23 is a block diagram showing still another example of the phase detection circuit 500 having the abnormality detection function.

In the examples of FIGS. 22 and 23, because the output of the integration circuit 520 is 0 in the normal state, the threshold for detecting an abnormality is set to have a certain width above and below 0 at a center. With these examples, since whether the phase of the reference signal 546 is able to follow the input signal is checked, it is possible to detect whether the operation of the phase detection circuit 500 is normal, and to detect whether a relative amplitude ratio between the signals 110 and 120 from the resolver 100 is normal. For example, an abnormality of the signal caused by a layer short in coils of the resolver 100 can be detected.

Further, since the output of the integration circuit 520 reflects the amplitude of a signal component that is not to be mixed in a desired condition, e.g., a noise component mixed in the signals 110 and 120 from the resolver 100, it is possible to detect deterioration of S/N of the signals 110 and 120 from the resolver 100.

Figure 21:
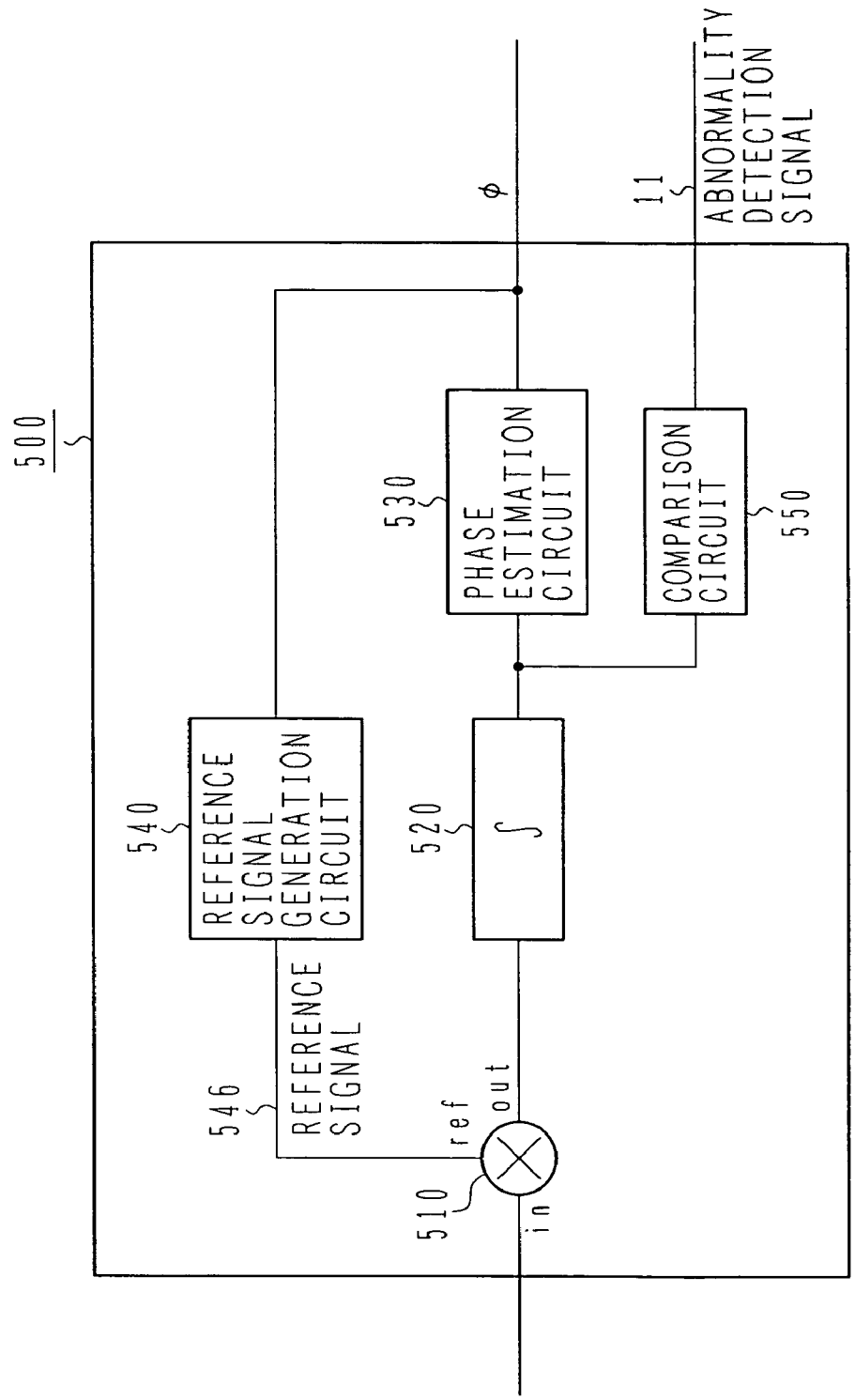
FIG. 21 is a block diagram showing an example of the phase detection circuit 500 having the abnormality detection function.
Figure 24:
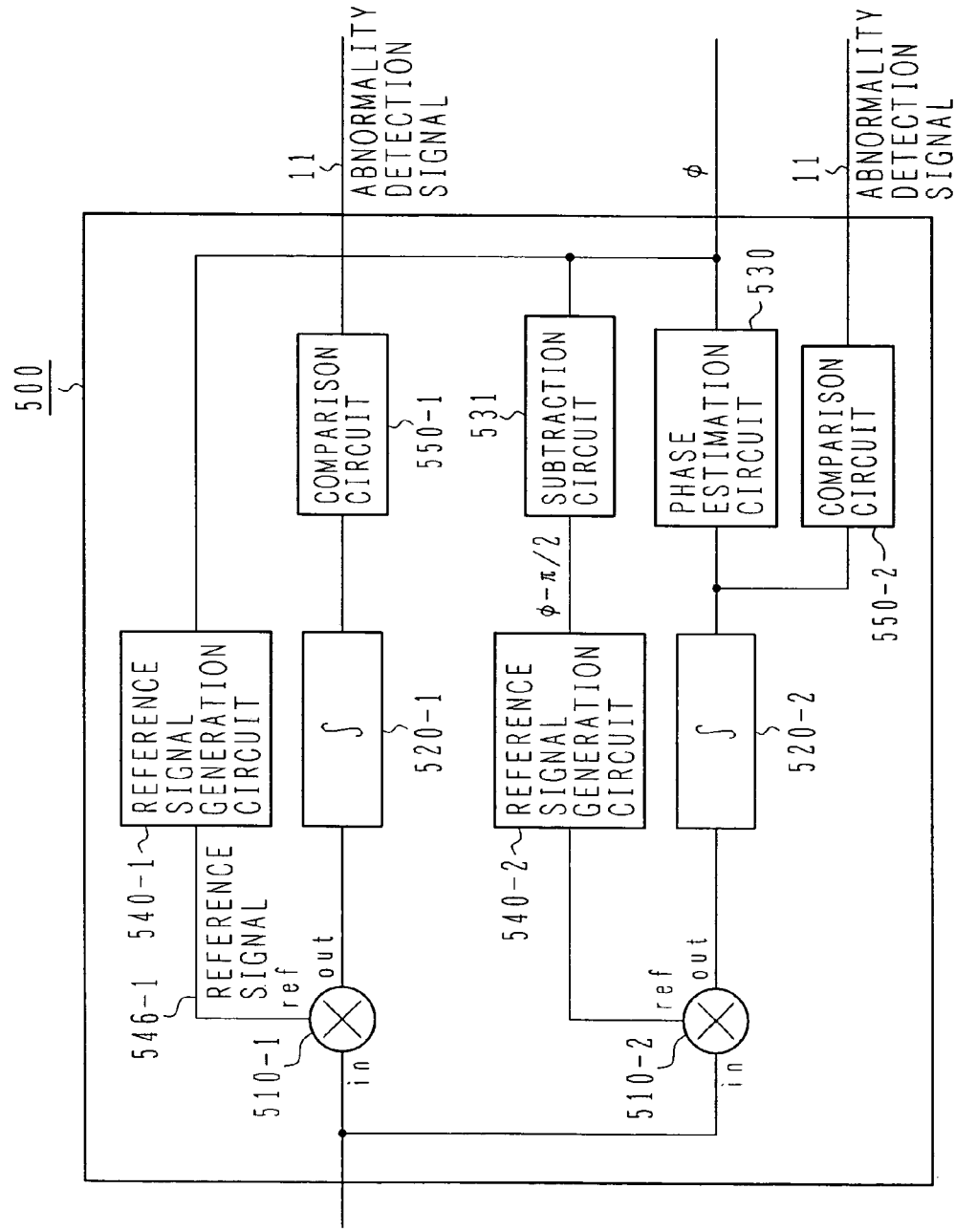
FIG. 24 is a block diagram showing still another example of the phase detection circuit 500 having the abnormality detection function.

By combining the examples of FIGS. 21 and 22 with each other as shown in FIG. 24, it is possible to detect an abnormality in not only the absolute amplitudes of the signals 110 and 120 from the resolver 100, but also in S/N of the signals 110 and 120 from the resolver 100. In order to obtain the estimated value φ of the rotational angle, the example of FIG. 24 employs the loop, shown in FIG. 19, in which the phase of the reference signal is shifted 90° from the estimated value φ obtained in the phase estimation circuit 530 to determine the correlation. Thus, since the sign of the correlation function value represents the direction in which the estimated value φ obtained in the phase estimation circuit 530 is to be corrected, the phase estimation circuit 530 can be simplified.

As an alternative, though not shown, the estimated value φ of the rotational angle may be obtained by employing the loop, shown in FIG. 2, in which the phase of the reference signal is used as the estimated value φ obtained in the phase estimation circuit 530. In this case, however, the sign of the correlation function value does not represent the direction in which the estimated value φ obtained in the phase estimation circuit 530 is to be corrected. For that reason, a relatively complicated algorithm, such as a hill-climbing method or a steepest descent (ascent) method, is required in the phase estimation circuit 530 to search for φ at which the correlation function value is maximized. Hence the phase estimation circuit 530 is more complicated.

It is needless to say, though not shown, that the examples of FIGS. 21 and 23 can also be combined with each other. In order to obtain the estimated value φ of the rotational angle, this combined case can also employ one of the loop, shown in FIG. 19, in which the phase of the reference signal is shifted 90° from the estimated value φ obtained in the phase estimation circuit 530 to determine the correlation, and the loop, shown in FIG. 2, in which the phase of the reference signal is used as the estimated value φ obtained in the phase estimation circuit 530. In this case, the method using the former loop is similarly advantageous in simplifying the phase estimation circuit 530.

Figure 25:
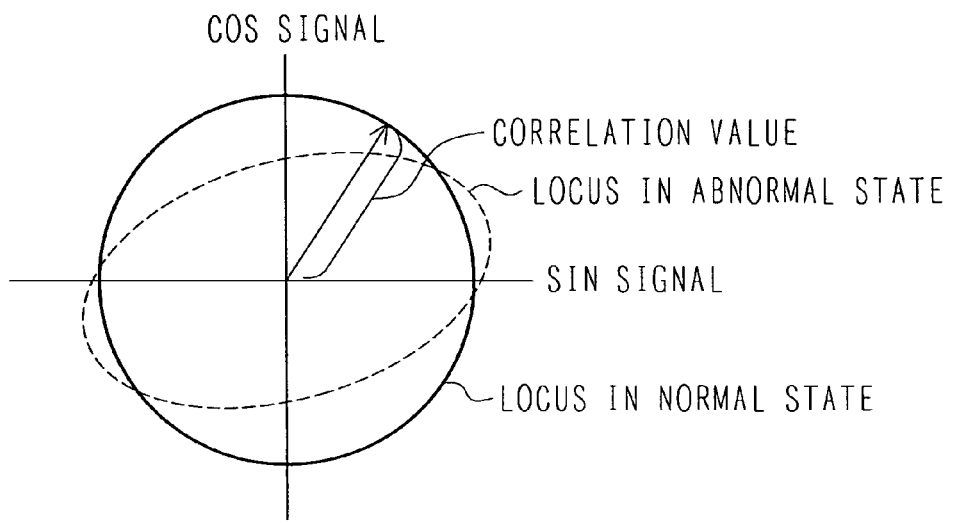
FIG. 25 is a graph showing an example of locus (Lissajous' figure) of the input signal.

When one resolver signal (SIN signal) and the other resolver signal (COS signal) are plotted respectively on a horizontal axis and a vertical axis, a locus of plots lies on a true circle if the resolver is normal, and it deviates from a true circle if the resolver is abnormal. The correlation function value obtained without providing the offset of 90° as in the examples of FIGS. 21 and 24 represents the distance from the origin of a graph, as shown in FIG. 25, in which one resolver signal (SIN signal) and the other resolver signal (COS signal) are plotted respectively on the horizontal axis and the vertical axis. By detecting a deviation of the correlation function value from the predetermined value, therefore, it is possible to detect the fact that the locus of plots is deviated from a true circle, i.e., an abnormality of the resolver.

Figure 26:
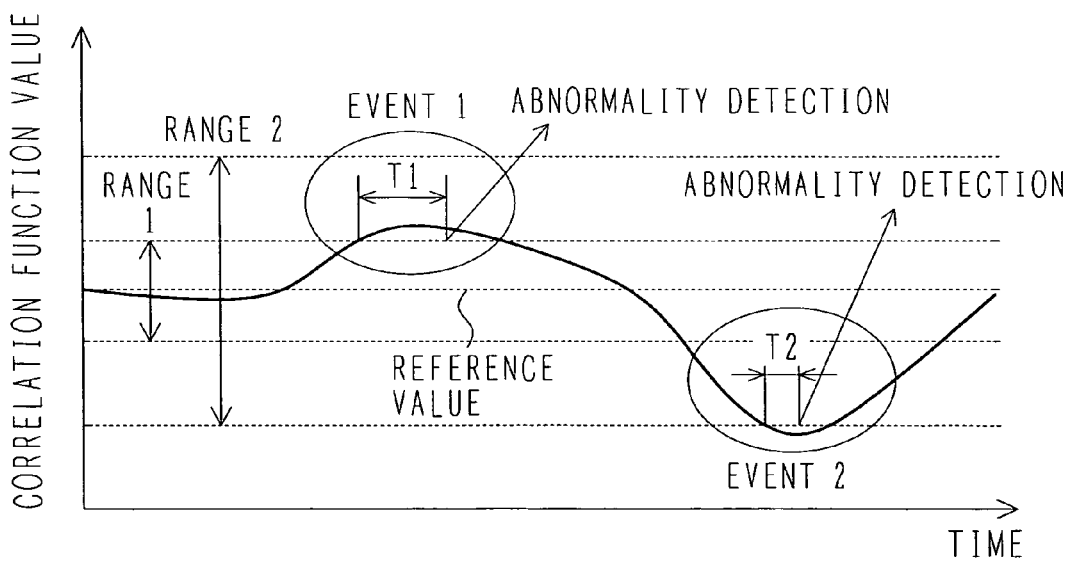
FIG. 26 is a chart showing an example of operation of the abnormality detection function.

Also, as shown in FIG. 26, by determining the presence of an abnormality if the correlation function value deviates from the predetermined range for a period of not shorter than a certain time in continuation, false detection due to the influence of temporary noise, etc. can be avoided. Further, as shown in FIG. 26, the range for the abnormality detection may be set in multiple stages and a deviation duration time for determining the presence of an abnormality may be set for each of the stages. In FIG. 26, two ranges 1 and 2 are each set as the range for the abnormality detection, and the deviation duration time for determining the presence of an abnormality is set to T1 and T2 for the ranges 1 and 2, respectively. In an event 1 in FIG. 26, an abnormality is detected if the correlation function value deviates from the range 1 for a period of not shorter than the time T1. In an event 2, an abnormality is detected if the correlation function value deviates from the range 2 for a period of not shorter than the time T2. The deviation duration time for determining the presence of an abnormality is preferably set to a shorter time for a larger range. In the example of FIG. 26, it is preferable to satisfy T1<T2. While the example of FIG. 26 sets two ranges, i.e., the ranges 1 and 2, a larger number of ranges may also be set as a matter of course.

According to the examples shown in FIGS. 21-24, as described above, an abnormality of the resolver and the resolver/digital converter can be detected. The system operation to be performed upon the detection of an abnormality differs depending on the use of the system. In many cases, a not-shown main relay or relay, the latter being inserted in series at an output of each phase for driving a motor, is turned off to cut off a motor driving current, thus performing the fail-safe operation.

In many cases, at the same time, the rotational angle of a motor output shaft is held at a predetermined angle by a certain mechanical spring mechanism. In an electronically controlled throttle, for example, the rotational angle of the motor output shaft is held so as to provide a throttle opening at which an engine takes a revolution speed of about 1200 rpm. In an electric brake, the rotational angle of the motor output shaft is held at a value at which no brake is applied. On the other hand, in an electric power steering system, a main relay or a relay, the latter being inserted in series at an output of each phase for driving a motor, is turned off to hold the motor in an inoperative state while manual steering is enabled to ensure the fail-safe operation. In an electric vehicle, a main relay or a relay, the latter being inserted in series at an output of each phase for driving a motor, is turned off to hold the motor in an inoperative state such that the vehicle runs in a coasting mode.

Figure 27:
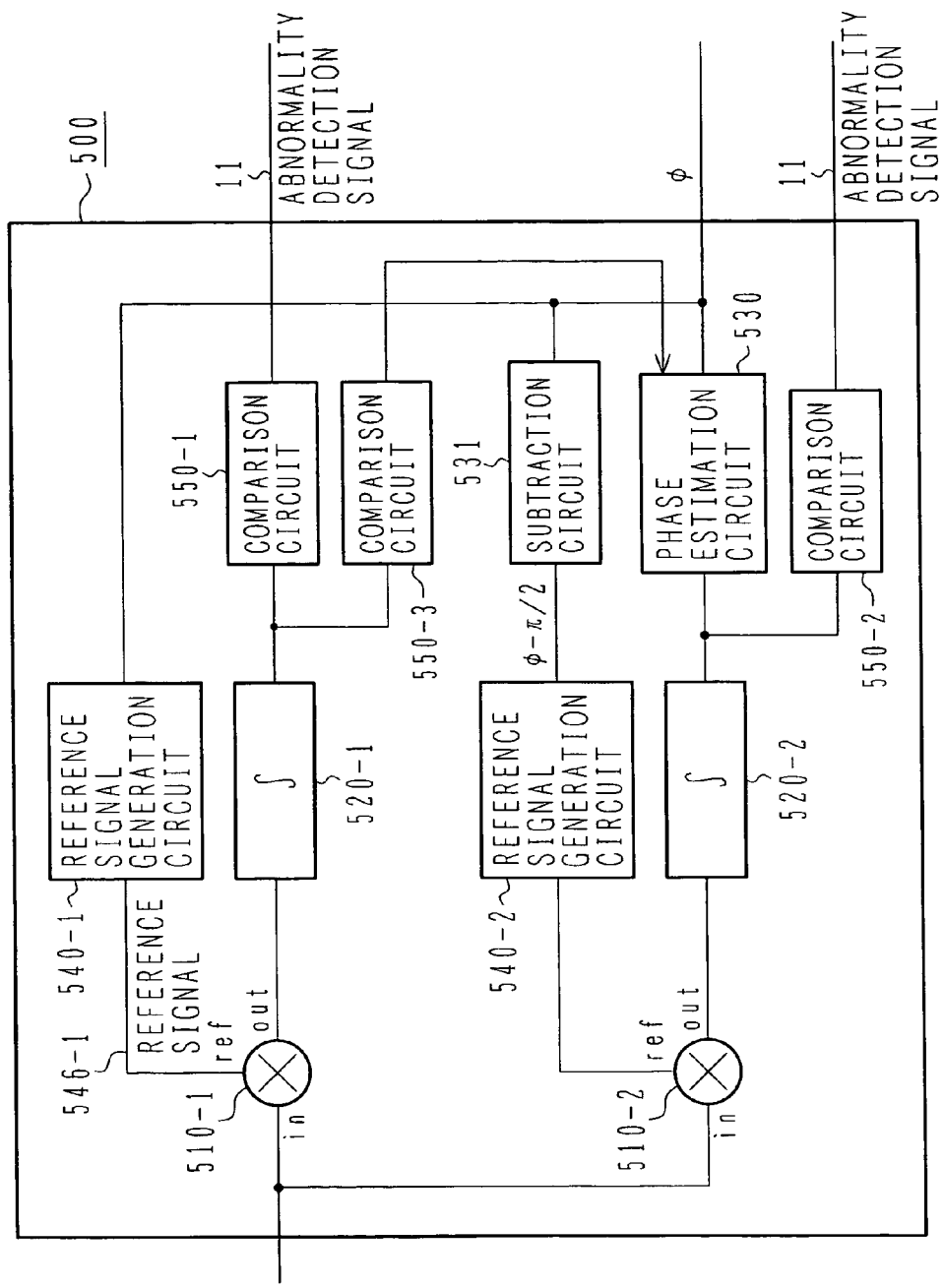
FIG. 27 is a block diagram showing still another example of the phase detection circuit 500 having the abnormality detection function.

When the difference between an initial value of the estimated angle output $\phi$ and the actual angle $\theta$ is near 180°, the correlation function value is small due to periodicity of signal waveform and a feedback gain is also small, thus resulting in a longer converging time. In that case, the correlation function value is −1.0. Therefore, when the correlation function value is −1.0, the converging operation can be expedited, as shown in FIG. 27, by forcibly setting the initial value of the estimated angle output $\phi$ to be within the range of the actual angle $\theta \pm 90°$. More specifically, in the example of FIG. 27, the converging operation can be expedited by detecting in a comparison circuit 550-3 the fact that the correlation function value is near −1.0, and by setting the initial value of the estimated angle output $\phi$ to be within the range of the actual angle $\theta \pm 90°$ in the phase estimation circuit 530.

Figure 28:
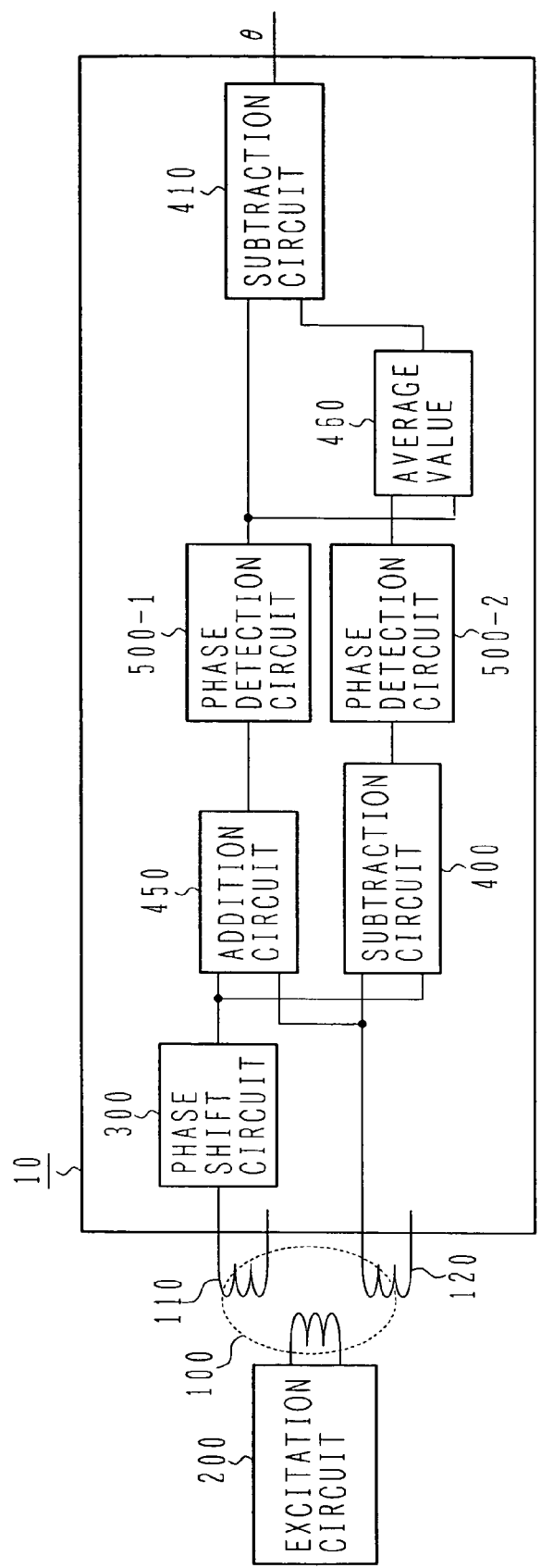
FIG. 28 is a block diagram showing an example of the resolver/digital converter to which is applied the present invention.
Figure 29:
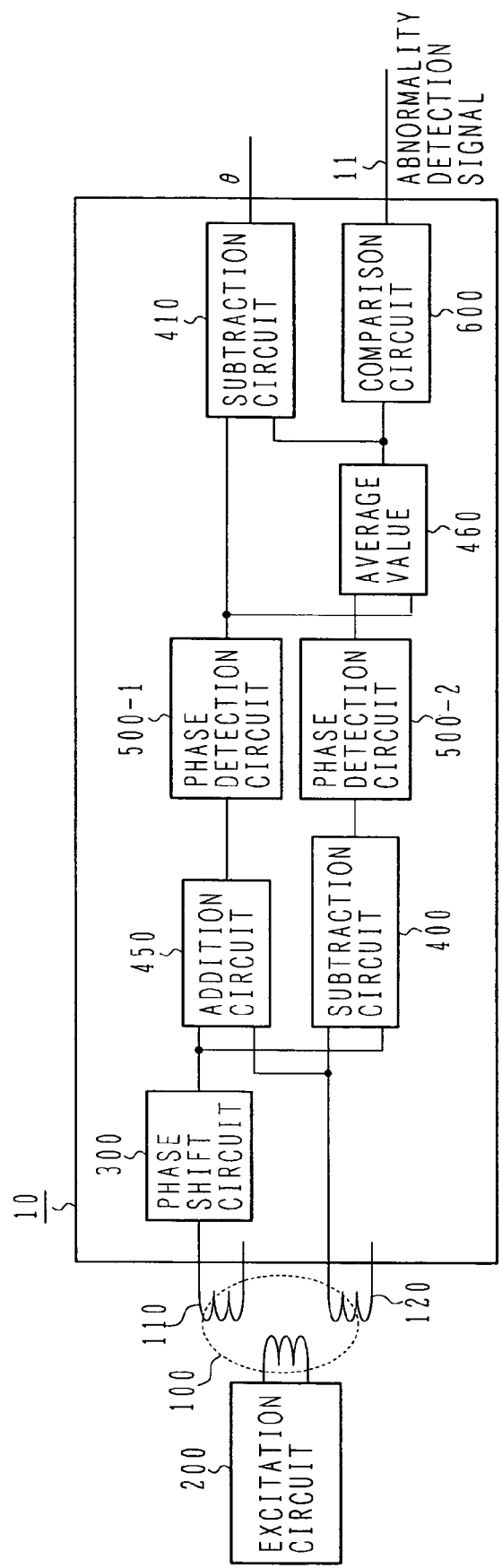
FIG. 29 is a block diagram showing another example of the resolver/digital converter to which is applied the present invention.
Figure 30:
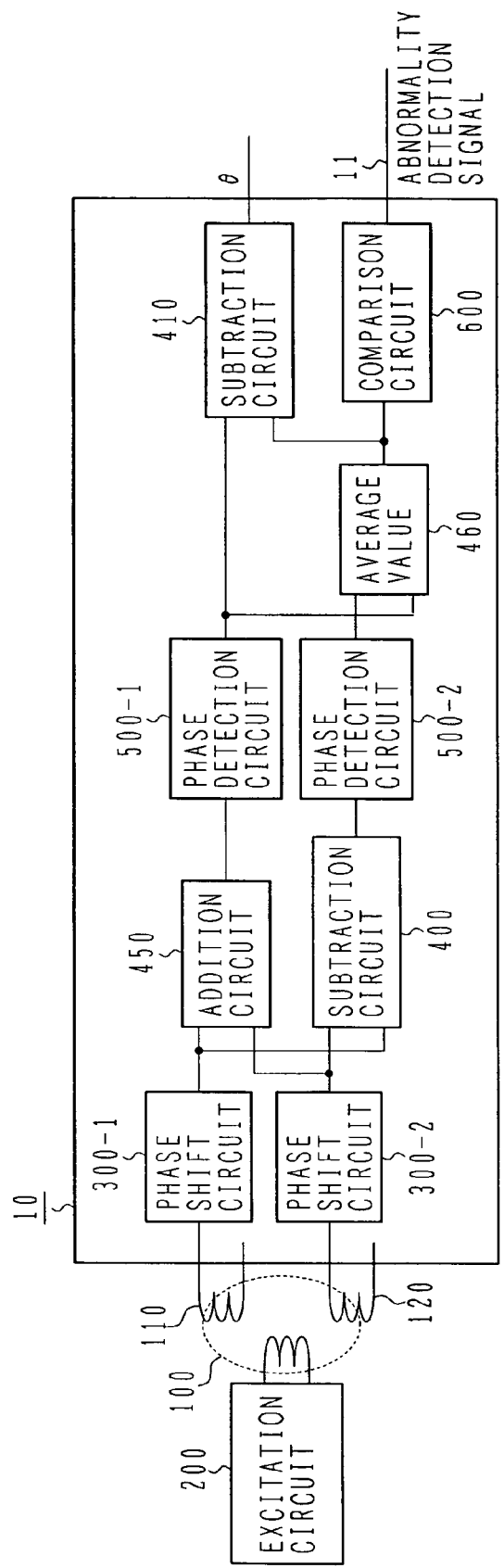
FIG. 30 is a block diagram showing still another example of the resolver/digital converter to which is applied the present invention.

FIGS. 28-30 show examples of the resolver/digital converter 10 using the phase detection circuit 500 according to the present invention.

FIG. 28 shows the example in which the present invention is applied to the resolver/digital converter that is designed to take the sum and the difference between a signal obtained by delaying the phase of the SIN signal from the resolver and the COS signal from the resolver, thereby removing a phase variation error, as in Patent Document 2. To take the sum and the difference between the resolver signals, this example includes not only a subtraction circuit 400, but also an addition circuit 450. Phase detection circuits 500-1 and 500-2 detect phases of respective outputs of the subtraction circuit 400 and the addition circuit 450. An average value circuit 460 takes an average of the detected phases to calculate a phase variation error. A subtraction circuit 410 subtracts the phase variation error from the output of the phase detection circuit 500-1, to thereby cancel the phase variation error.

By using, as each of the phase detection circuits 500-1 and 500-2 shown in FIG. 29, the phase detection circuit 500 according to the present invention which is shown in any of FIGS. 2, 19 and 20, the resolver/digital converter 10 having a small circuit scale and superior noise immunity can be realized. Also, by using, as each of the phase detection circuits 500-1 and 500-2, the phase detection circuit 500 according to the present invention which is shown in any of FIGS. 21-24, the resolver/digital converter 10 having the abnormality detection function can be realized.

Further, as shown in FIG. 29, the phase variation error outputted from the average value circuit 460 may be compared with a preset threshold in a comparison circuit 600, and the presence of an abnormality may be detected when the phase variation error exceeds the preset threshold.

FIG. 30 shows an example of applying the present invention to a resolver/digital converter in which the phase shift circuit is divided into two and the phase variation error of not smaller than 90° is avoided form being caused directly due to a failure of the phase shift circuit.

Phase shift circuits 300-1 and 300-2 shift the phases of the SIN signal 110 and the COS signal 120 from the resolver 100 such that the phase difference between those signals is desirably 90°. The SIN signal 110 and the COS signal 120 are then each inputted to the subtraction circuit 400 and the addition circuit 450. The phase detection circuits 500-1 and 500-2 detect respectively the phases of outputs of the subtraction circuit 400 and the addition circuit 450. The average value circuit 460 takes an average of the detected phases to calculate a phase variation error. The subtraction circuit 410 subtracts the phase variation error from the output of the phase detection circuit 500-1, to thereby cancel the phase variation error. Further, the phase variation error outputted from the average value circuit 460 is compared with the preset threshold in the comparison circuit 600, and the presence of an abnormality is detected when the phase variation error exceeds the preset threshold.

By using, as each of the phase detection circuits 500-1 and 500-2 shown in FIG. 30, the phase detection circuit 500 according to the present invention which is shown in any of FIGS. 2, 19 and 20, the resolver/digital converter 10 having a small circuit scale and superior noise immunity can be realized. Also, by using, as each of the phase detection circuits 500-1 and 500-2, the phase detection circuit 500 according to the present invention which is shown in any of FIGS. 21-24, the resolver/digital converter 10 having the abnormality detection function can be realized.

Figure 31:
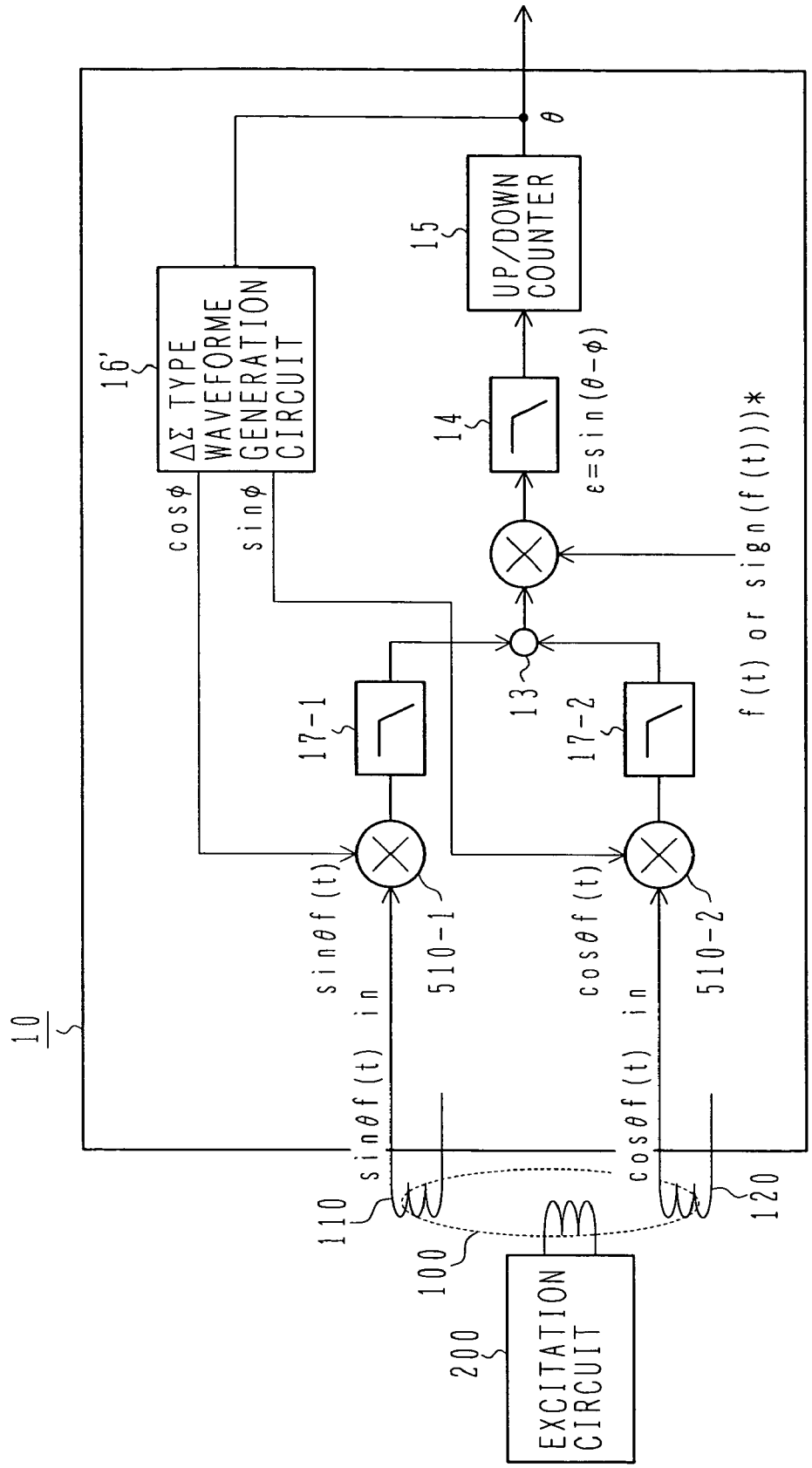
FIG. 31 is a block diagram showing still another example of the resolver/digital converter to which is applied the present invention.

FIG. 31 shows an example in which the multiplier according to the present invention is used to implement the method disclosed in Patent Document 1. A $\Delta\Sigma$-type waveform generation circuit 16' generates waveforms of $\cos\phi$ and $\sin\phi$ based on a SIN ROM 60 and a COS ROM 61 (shown in Patent Document 1). When the waveforms of $\cos\phi$ and $\sin\phi$ are expressed with $\Delta\Sigma$ modulation (oversampling), an analog signal is given in the form of a pulse train having a high frequency and values of N-ary notation, e.g., a pulse train having binary values of +1 and −1 or ternary values of +1, 0 and −1. After expressing the waveforms of $\cos\phi$ and $\sin\phi$ by binary or ternary values with the $\Delta\Sigma$ modulation in such a manner, a multiplication of the inputted resolver signal and each of $\cos\phi$ and $\sin\phi$ can be performed by the multiplier 510 shown in FIG. 7 or 9 (i.e., a multiplier 510-1 or 510-2 in FIG. 31). Accordingly, multiplication type D/A converters 51 and 52 shown in Patent Document 1 are not required and the circuit scale can be greatly reduced.

Figure 32:
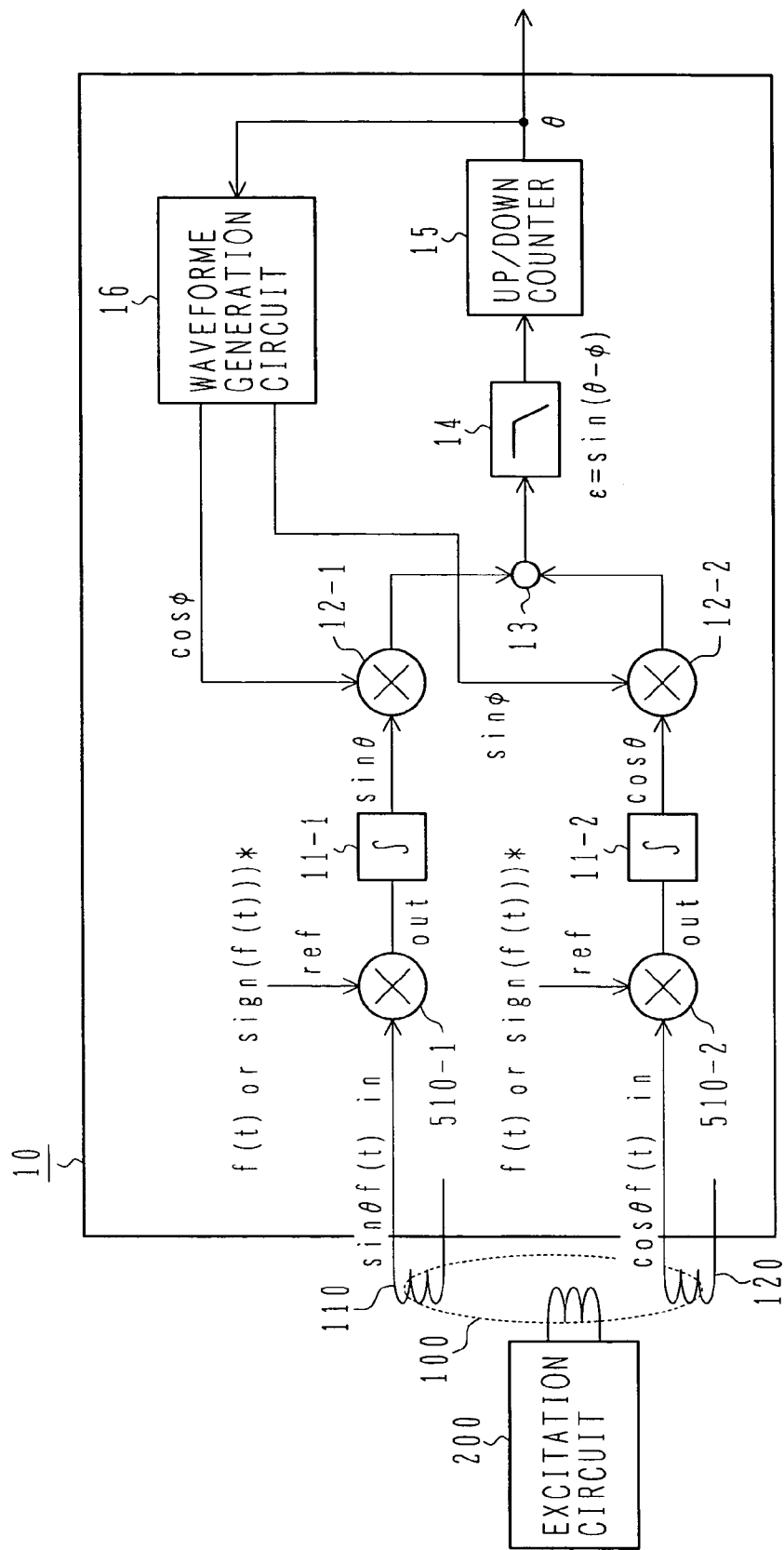
FIG. 32 is a block diagram showing still another example of the resolver/digital converter to which is applied the present invention.

FIG. 32 shows an example in which the multipliers 510-1 and 510-2 and integration circuits 11-1 and 11-2 according to the present invention are inserted in the initial stage of the resolver/digital converter disclosed in Patent Document 1, thereby performing the so-called synchronous detection. While the method disclosed in Patent Document 1 is required to perform the operation using the frequency of the excitation signal until the final stage circuit of the resolver/digital converter, the example of FIG. 32 is required to handle only a signal of low frequency component representing just the envelop of the resolver signal in a section after the multipliers 510-1 and 510-2 and the integration circuits 11-1 and 11-2. Accordingly, the operations of the multiplier 11-1 and 11-2 can be executed at lower speed, and the circuit scale can be reduced by constituting the circuits in the digital form.

Figure 33:
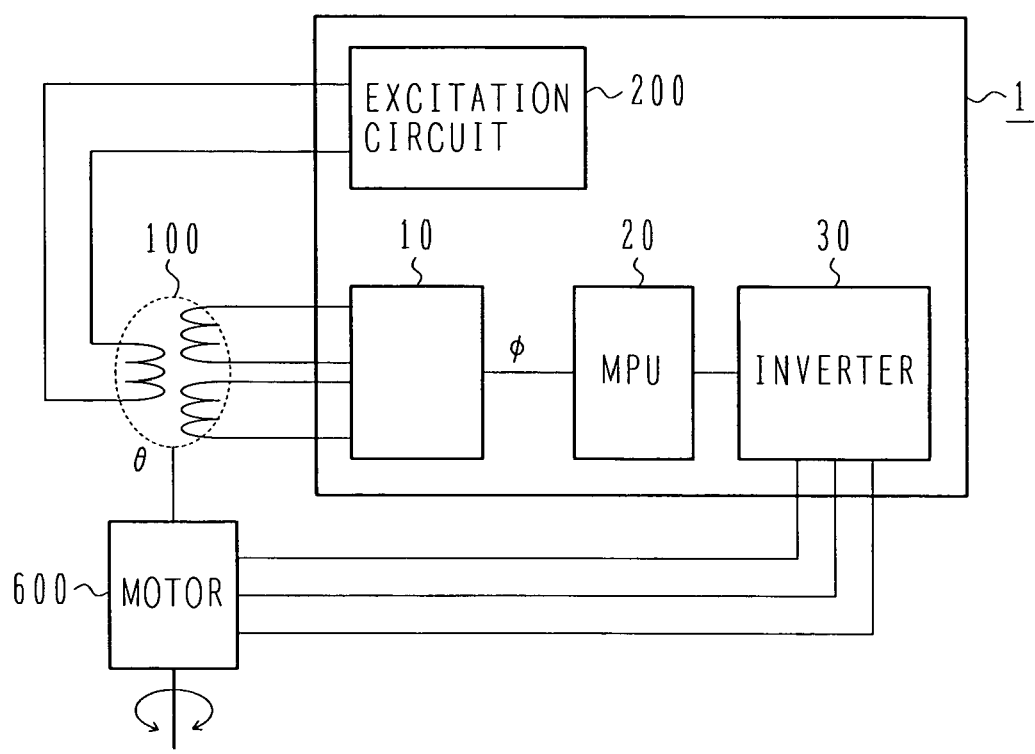
FIG. 33 is a block diagram showing an example of a motor controller and a motor control system to which is applied the present invention.

FIG. 33 shows an example in which the resolver/digital converter 10 according to the present invention is applied to a motor controller 1 and a motor control system. An excitation signal 230 outputted from an excitation circuit 200 is inputted to a resolver 100. The resolver 100 shares a rotary shaft with a motor 600 and outputs a signal corresponding to a rotational angle θ of the motor 600. The output signal is inputted to the resolver/digital converter 10. Based on the input signal, the resolver/digital converter 10 estimates the rotational angle θ and outputs an estimated value φ. A microprocessing unit (MPU) 20 outputs, to an inverter 30, a command for producing a three-phase AC current having a proper phase in accordance with the estimated value φ, and the inverter 30 outputs the three-phase AC current in accordance with the command from the microprocessing unit 20, thereby driving the motor 600. In many cases, control in the microprocessing unit 20 is executed in a manner of vector control, and the command outputted from the microprocessing unit 20 to produce the three-phase AC current is given as a PWM (Pulse Width Modulation) wave representing the duty of an output for each phase.

Figure 34:
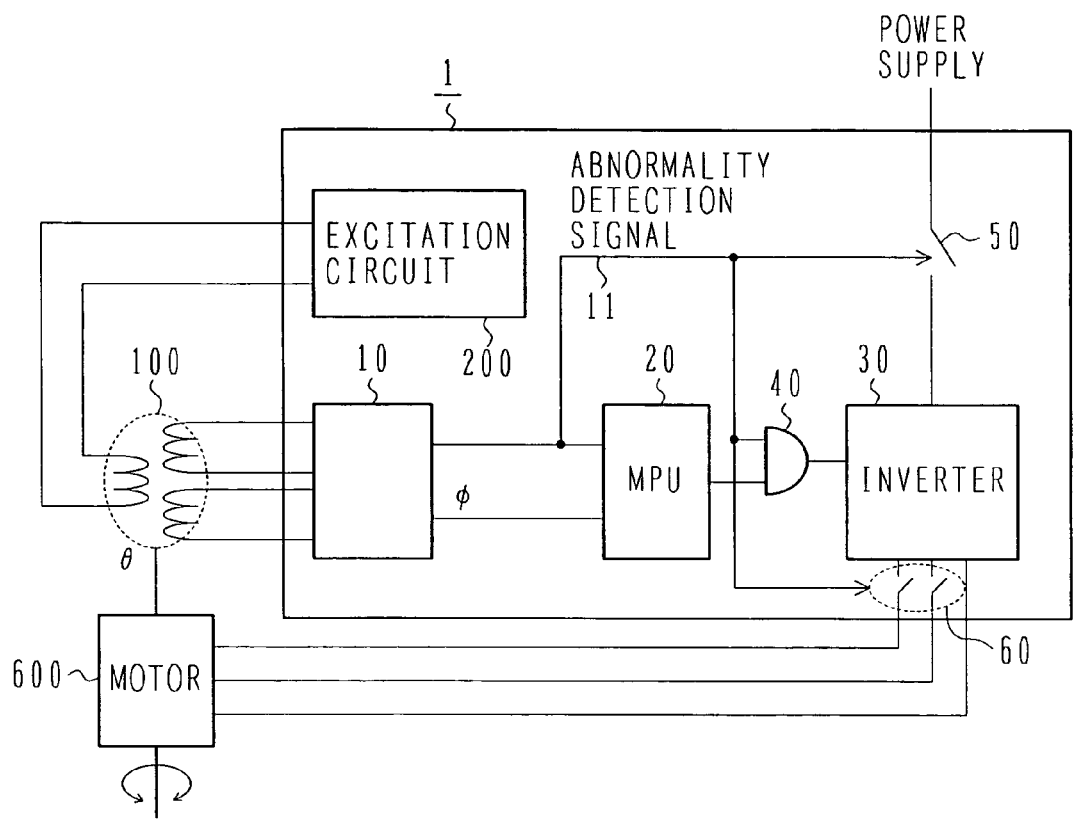
FIG. 34 is a block diagram showing another example of a motor controller and a motor control system to which is applied the present invention.

FIG. 34 shows an example in which failsafe operation is realized by using the abnormality detection signal 11 from the resolver/digital converter 10 according to the present invention. As shown, the abnormality detection signal 11 can be inputted to the MPU 20 to stop a driving signal supplied to the inverter 30 upon the occurrence of an abnormality. Alternatively, the abnormality detection signal 11 may be inputted to a logical circuit 40 to stop the driving signal supplied to the inverter 30 upon the occurrence of an abnormality.

The abnormality detection signal 11 can also be used to control a switch or relay 50 inserted in a power supply line connected to the inverter 30, to thereby turn off the switch or relay 50 and stop supply of source power to the inverter 30 upon the occurrence of an abnormality.

Moreover, the abnormality detection signal 11 can be used to control a switch or relay 60 inserted in an output line for driving the inverter 30, to thereby turn off the switch or relay 60 and stop supply of driving power to the motor 600 upon the occurrence of an abnormality. By employing at least one of those arrangements or two or more of them in a combined way, the operation of the motor 600 can be stopped and a control target can be held in a failsafe state when an abnormality occurs in the resolver 100 or the resolver/digital converter 10.

Though not shown, an abnormality occurred in the resolver/digital converter 10 itself can be detected by providing a plurality of resolver/digital converters 10 with redundancy. Further, by employing different types of resolver/digital converters 10 in a combined manner with redundancy, it is possible to compensate for drawbacks specific to individual schemes based on design diversity, and to realize a control system having higher safety.

Figure 35:
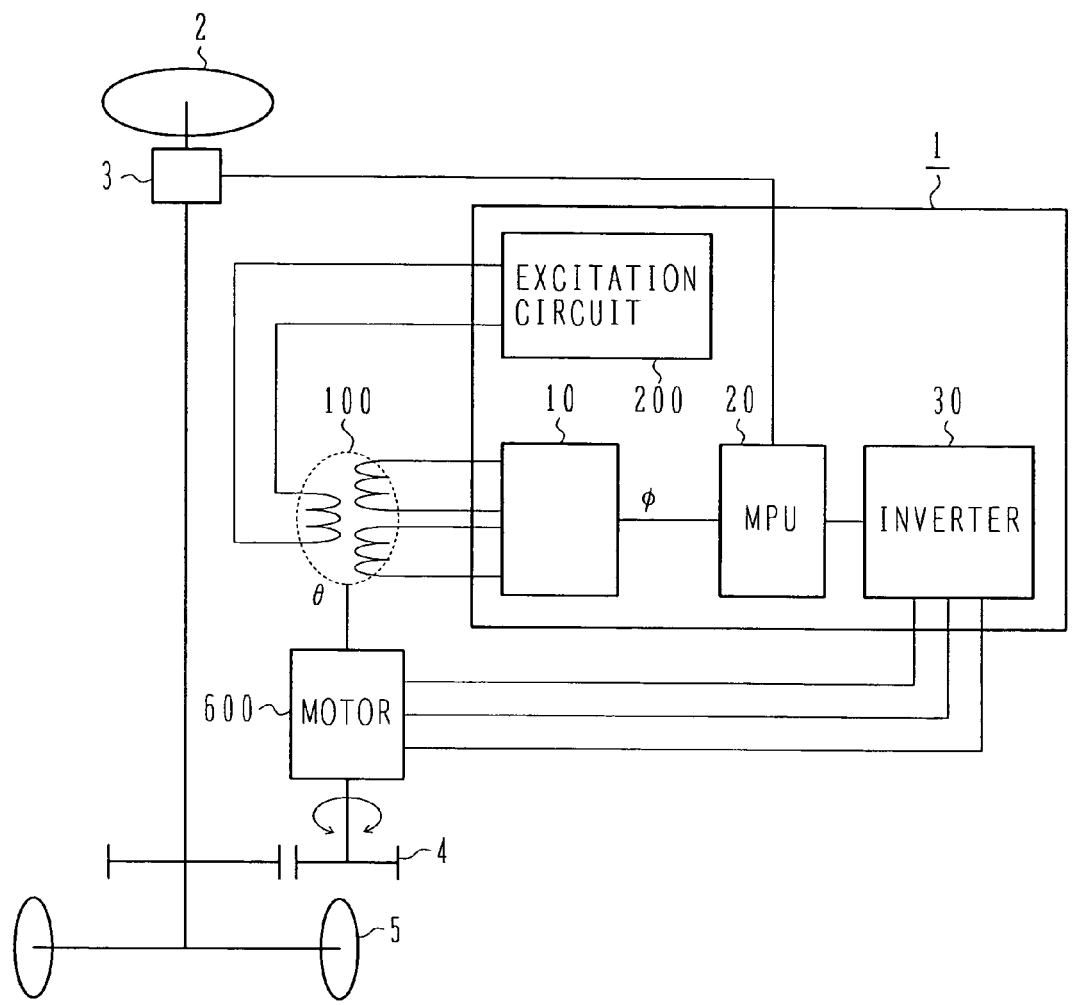
FIG. 35 is a block diagram showing an example of an electric power steering system to which is applied the present invention.

FIG. 35 shows an example in which the resolver/digital converter 10 according to the present invention is applied to an electric power steering system. In addition to the motor controller 1 and the motor control system in FIG. 33, a steering wheel 2, a torque sensor 3, and a steering mechanism 5 are mechanically coupled to the output shaft of the motor 600 through a speed reduction mechanism 4. A steering force applied from a driver is detected by the torque sensor 3, and the motor controller 1 performs control such that and the motor 600 outputs assist torque depending on the applied steering force.

While the above description is made in connection with the example of application to the electric power steering system, an electric braking system can also be realized by coupling, instead of the steering mechanism 5, a brake operating mechanism to the output shaft of the motor 600 through the speed reduction mechanism 4.

In this specification, the present invention has been described in connection with the case of a variable reluctance resolver in which the resolver has an excitation coil and a resolver signal coil and a signal amplitude in the resolver signal coil is changed with rotation of a core. However, the present invention is also similarly applicable to a variable inductance resolver in which the inductance of a resolver signal coil is changed with rotation of a core and the inductance change is taken out as a change of signal voltage through a bridge circuit.

What is claimed is:

1. A phase detection circuit comprising:
a first multiplier for multiplying an input signal by a first reference signal and outputting a first signal;
a first integration circuit for integrating the first signal and outputting a second signal;
a phase estimation circuit for estimating phase information based on the second signal; and
a first reference signal generation circuit for generating the first reference signal based on the estimated phase information.

2. The phase detection circuit according to claim 1, wherein the phase information is an output signal of said phase detection circuit.

3. The phase detection circuit according to claim 1, wherein said phase detection circuit detects the phase information based on information representing an entire waveform of the input signal.

4. The phase detection circuit according to claim 1, wherein the first reference signal generated by said first reference signal generation circuit has a discrete value.

5. The phase detection circuit according to claim 4, wherein the first reference signal generated by said first reference signal generation circuit has a binary value.

6. The phase detection circuit according to claim 4, wherein the first reference signal generated by said first reference signal generation circuit has a ternary value.

7. The phase detection circuit according to claim 6, wherein the first reference signal generated by said first reference signal generation circuit is +1 in a first range covering a phase angle width of 120°, 0 in a second range covering a succeeding phase angle width of 60°, −1 in a third range covering a succeeding phase angle width of 120°, and 0 in a fifth range covering a succeeding phase angle width of 60°.

8. The phase detection circuit according to claim 1, wherein a phase difference of 90° exists between a phase indicated by the image information outputted from said phase estimation circuit and a phase of the first reference signal.

9. The phase detection circuit according to claim 8, wherein said phase estimation circuit increases and decreases the phase information depending on a polarity of the second signal outputted from said first integration circuit.

10. The phase detection circuit according to claim 1, wherein said phase detection circuit further comprises a first comparison circuit, and said first comparison circuit compares a predetermined value with a value of the second signal outputted from said first integration circuit, and determines the occurrence of an abnormal state when the value of the second signal deviates from a predetermined range.

11. The phase detection circuit according to claim 10, wherein said first comparison circuit determines the occurrence of an abnormal state when the value of said second signal deviates from the predetermined range for a period of not shorter than a preset duration time.

12. The phase detection circuit according to claim 11, wherein said predetermined range is set plural, and
said preset duration time is set for each of the plural predetermined ranges.

13. The phase detection circuit according to claim 10, further comprising:
a second reference signal generation circuit for generating a second reference signal based on the phase information;
a second multiplier for multiplying the input signal by a second reference signal and outputting a third signal;
a second integration circuit for integrating the third signal and outputting a fourth signal; and
a second comparison circuit for comparing the fourth signal with a predetermined range and determining the occurrence of an abnormal state when the fourth signal deviates from the predetermined range.

14. The phase detection circuit according to claim 13, wherein a phase difference of 90° exists between a phase of the first reference signal outputted from said first reference signal generation circuit and a phase indicated by the image information outputted from said phase estimation circuit.

15. The phase detection circuit according to claim 14, wherein when an output value of said second integration circuit is negative, the phase information outputted from said phase estimation circuit is increased 90°.

16. A resolver/digital converter receiving at least two signals from a resolver and comprising a phase shift circuit, a subtraction circuit, and a phase detection circuit,
wherein one signal from said resolver is inputted to said phase shift circuit in which a phase of the one signal is shifted,
an output of said phase shift circuit is subtracted from the other signal from said resolver in said subtraction circuit, and
an output of said subtraction circuit is inputted to said phase detection circuit which detects a phase of the output of said subtraction circuit and outputs the detected phase as information indicating a rotational angle of said resolver,
said phase detection circuit being the phase detection circuit according to claim 1.

* * * * *